(12) United States Patent
Lusky et al.

(10) Patent No.: US 7,638,850 B2
(45) Date of Patent: Dec. 29, 2009

(54) NON-VOLATILE MEMORY STRUCTURE AND METHOD OF FABRICATION

(75) Inventors: Eli Lusky, Tel-Aviv (IL); Assaf Shappir, Kiryat Ono (IL); Rustom Irani, Santa Clara, CA (US); Boaz Eitan, Ra'anana (IL)

(73) Assignee: Saifun Semiconductors Ltd., Netanya (IL)

( * ) Notice: Subject to any disclaimer, the term of this patent is extended or adjusted under 35 U.S.C. 154(b) by 117 days.

(21) Appl. No.: 11/440,624

(22) Filed: May 24, 2006

(65) Prior Publication Data

US 2006/0211188 A1 Sep. 21, 2006

Related U.S. Application Data

(63) Continuation-in-part of application No. 11/247,733, filed on Oct. 11, 2005.

(60) Provisional application No. 60/618,165, filed on Oct. 14, 2004.

(51) Int. Cl.
H01L 29/76 (2006.01)

(52) U.S. Cl. ............................. 257/390; 257/E29.134; 257/E29.135; 257/E29.137

(58) Field of Classification Search ................. 257/314, 257/315, E29.134, E29.135, E29.137, 390; 438/201, 211, 257
See application file for complete search history.

(56) References Cited

U.S. PATENT DOCUMENTS

| | | | |
|---|---|---|---|
| 3,881,180 A | 4/1975 | Gosney, Jr. | |
| 3,895,360 A | 7/1975 | Cricchi et al. | |
| 3,952,325 A | 4/1976 | Beale et al. | |
| 4,016,588 A | 4/1977 | Ohya et al. | |
| 4,017,888 A | 4/1977 | Christie et al. | |
| 4,145,703 A | 3/1979 | Blanchard et al. | |
| 4,151,021 A | 4/1979 | McElroy | |
| 4,173,766 A | 11/1979 | Hayes | |
| 4,173,791 A | 11/1979 | Bell | |
| 4,247,861 A | 1/1981 | Hsu et al. | |
| 4,257,832 A | 3/1981 | Schwabe et al. | |
| 4,281,397 A | 7/1981 | Neal et al. | |
| 4,306,353 A | 12/1981 | Jacobs et al. | |
| 4,342,102 A | 7/1982 | Puar | |
| 4,342,149 A | 8/1982 | Jacobs et al. | |
| 4,360,900 A | 11/1982 | Bate | |
| 4,373,248 A | 2/1983 | McElroy | |

(Continued)

FOREIGN PATENT DOCUMENTS

EP 0 656 628 6/1995

(Continued)

OTHER PUBLICATIONS

U.S. Appl. No. 08/902,890, filed Jul. 30, 1997, Eitan.

(Continued)

*Primary Examiner*—Michelle Estrada
(74) *Attorney, Agent, or Firm*—EMPK & Shiloh, LLP

(57) ABSTRACT

A method for creating a non-volatile memory array includes implanting pocket implants in a substrate at least between mask columns of a given width and at least through an ONO layer covering the substrate, generating increased-width polysilicon columns from the mask columns, generating bit lines in the substrate at least between the increased-width polysilicon columns and depositing oxide at least between the polysilicon columns.

7 Claims, 22 Drawing Sheets

U.S. PATENT DOCUMENTS

| | | |
|---|---|---|
| 4,380,057 A | 4/1983 | Kotecha et al. |
| 4,388,705 A | 6/1983 | Sheppard |
| 4,389,705 A | 6/1983 | Sheppard |
| 4,404,747 A | 9/1983 | Collins |
| 4,435,786 A | 3/1984 | Tickle |
| 4,448,400 A | 5/1984 | Harari |
| 4,471,373 A | 9/1984 | Shimizu et al. |
| 4,494,016 A | 1/1985 | Ransom et al. |
| 4,507,673 A | 3/1985 | Aoyama |
| 4,521,796 A | 6/1985 | Rajkanan et al. |
| 4,527,257 A | 7/1985 | Cricchi |
| 4,586,163 A | 4/1986 | Koike |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,725,984 A | 2/1988 | Ip et al. |
| 4,733,105 A | 3/1988 | Shin et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,847,808 A | 7/1989 | Kobatake |
| 4,857,770 A | 8/1989 | Partovi et al. |
| 4,870,470 A | 9/1989 | Bass, Jr. et al. |
| 4,888,735 A | 12/1989 | Lee et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,029,063 A | 7/1991 | Lingstaedt et al. |
| 5,042,009 A | 8/1991 | Kazerounian et al. |
| 5,075,245 A | 12/1991 | Woo et al. |
| 5,081,371 A | 1/1992 | Wong |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,092 A | 3/1994 | Hotta et al. |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,334,555 A | 8/1994 | Sugiyama et al. |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,375,094 A | 12/1994 | Naruke |
| 5,381,374 A | 1/1995 | Shiraishi et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,434,825 A | 7/1995 | Harari et al. |
| 5,436,478 A | 7/1995 | Bergemont et al. |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,508,968 A | 4/1996 | Collins et al. |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,018 A | 9/1996 | Wang et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee et al. |
| 5,606,523 A | 2/1997 | Mirabel |
| 5,608,679 A | 3/1997 | Mi et al. |
| 5,612,642 A | 3/1997 | McClinyock |
| 5,617,357 A | 4/1997 | Haddad et al. |
| 5,623,438 A | 4/1997 | Guritz et al. |
| 5,627,790 A | 5/1997 | Golla et al. |
| 5,633,603 A | 5/1997 | Lee |
| 5,636,288 A | 6/1997 | Bonneville et al. |
| 5,644,531 A | 7/1997 | Kuo et al. |
| 5,654,568 A | 8/1997 | Nakao |
| 5,656,513 A | 8/1997 | Wang et al. |
| 5,657,332 A | 8/1997 | Auclair et al. |
| 5,661,060 A | 8/1997 | Gill et al. |
| 5,663,907 A | 9/1997 | Frayer et al. |

| | | | | | | |
|---|---|---|---|---|---|---|
| 5,672,959 | A | 9/1997 | Der | 5,949,714 | A | 9/1999 | Hemink et al. |
| 5,675,280 | A | 10/1997 | Nomura | 5,949,728 | A | 9/1999 | Liu et al. |
| 5,677,867 | A | 10/1997 | Hazani | 5,963,412 | A | 10/1999 | En |
| 5,677,869 | A | 10/1997 | Fazio et al. | 5,963,465 | A | 10/1999 | Eitan |
| 5,683,925 | A | 11/1997 | Irani et al. | 5,966,603 | A | 10/1999 | Eitan |
| 5,689,459 | A | 11/1997 | Chang et al. | 5,969,989 | A | 10/1999 | Iwahashi |
| 5,694,356 | A | 12/1997 | Wong et al. | 5,969,993 | A | 10/1999 | Takeshima |
| 5,696,929 | A | 12/1997 | Hasbun et al. | 5,973,373 | A | 10/1999 | Krautschneider et al. |
| 5,708,608 | A | 1/1998 | Park et al. | 5,982,666 | A | 11/1999 | Campardo |
| 5,712,814 | A | 1/1998 | Fratin et al. | 5,986,940 | A | 11/1999 | Atsumi et al. |
| 5,712,815 | A | 1/1998 | Bill et al. | 5,990,526 | A | 11/1999 | Bez et al. |
| 5,715,193 | A | 2/1998 | Norman | 5,991,202 | A | 11/1999 | Derhacobian et al. |
| 5,717,581 | A | 2/1998 | Canclini | 5,999,444 | A | 12/1999 | Fujiwara et al. |
| 5,717,632 | A | 2/1998 | Richart et al. | 5,999,494 | A | 12/1999 | Holzrichter |
| 5,717,635 | A | 2/1998 | Akatsu | 6,000,006 | A | 12/1999 | Bruce et al. |
| 5,726,946 | A | 3/1998 | Yamagata et al. | 6,005,423 | A | 12/1999 | Schultz |
| 5,748,534 | A | 5/1998 | Dunlap et al. | 6,011,725 | A | 1/2000 | Eitan |
| 5,751,037 | A | 5/1998 | Aozasa et al. | 6,018,186 | A | 1/2000 | Hsu |
| 5,751,637 | A | 5/1998 | Chen et al. | 6,020,241 | A | 2/2000 | You et al. |
| 5,754,475 | A | 5/1998 | Bill et al. | 6,028,324 | A | 2/2000 | Su et al. |
| 5,760,445 | A | 6/1998 | Diaz | 6,030,871 | A | 2/2000 | Eitan |
| 5,760,634 | A | 6/1998 | Fu | 6,034,403 | A | 3/2000 | Wu |
| 5,768,192 | A | 6/1998 | Eitan | 6,034,896 | A | 3/2000 | Ranaweera et al. |
| 5,768,193 | A | 6/1998 | Lee et al. | 6,037,627 | A | 3/2000 | Kitamura et al. |
| 5,771,197 | A | 6/1998 | Kim | 6,040,610 | A | 3/2000 | Noguchi et al. |
| 5,774,395 | A | 6/1998 | Richart et al. | 6,044,019 | A | 3/2000 | Cernea et al. |
| 5,777,919 | A | 7/1998 | Chi-Yung et al. | 6,044,022 | A | 3/2000 | Nachumovsky |
| 5,781,476 | A | 7/1998 | Seki et al. | 6,063,666 | A | 5/2000 | Chang et al. |
| 5,781,478 | A | 7/1998 | Takeuchi et al. | 6,064,226 | A | 5/2000 | Earl |
| 5,783,934 | A | 7/1998 | Tran | 6,064,251 | A | 5/2000 | Park |
| 5,784,314 | A | 7/1998 | Sali et al. | 6,064,591 | A | 5/2000 | Takeuchi et al. |
| 5,787,036 | A | 7/1998 | Okazawa | 6,074,916 | A | 6/2000 | Cappelletti |
| 5,793,079 | A | 8/1998 | Georgescu et al. | 6,075,402 | A | 6/2000 | Ghilardelli |
| 5,801,076 | A | 9/1998 | Ghneim et al. | 6,075,724 | A | 6/2000 | Li et al. |
| 5,805,500 | A | 9/1998 | Campardo et al. | 6,078,518 | A | 6/2000 | Chevallier |
| 5,808,506 | A | 9/1998 | Tran | 6,081,456 | A | 6/2000 | Dadashev |
| 5,812,449 | A | 9/1998 | Song | 6,084,794 | A | 7/2000 | Lu et al. |
| 5,812,456 | A | 9/1998 | Hull et al. | 6,091,640 | A | 7/2000 | Kawahara et al. |
| 5,812,457 | A | 9/1998 | Arase | 6,094,095 | A | 7/2000 | Murray et al. |
| 5,815,435 | A | 9/1998 | Van Tran | 6,097,639 | A | 8/2000 | Choi et al. |
| 5,822,256 | A | 10/1998 | Bauer et al. | 6,107,862 | A | 8/2000 | Mukainakano et al. |
| 5,825,683 | A | 10/1998 | Chang et al. | 6,108,240 | A | 8/2000 | Lavi et al. |
| 5,825,686 | A | 10/1998 | Schmitt-Landsiedel et al. | 6,108,241 | A | 8/2000 | Chevallier |
| 5,828,601 | A | 10/1998 | Hollmer et al. | 6,117,714 | A | 9/2000 | Beatty |
| 5,834,851 | A | 11/1998 | Ikeda et al. | 6,118,207 | A | 9/2000 | Ormerod et al. |
| 5,835,935 | A | 11/1998 | Estakhri et al. | 6,118,692 | A | 9/2000 | Banks |
| 5,836,772 | A | 11/1998 | Chang et al. | 6,122,198 | A | 9/2000 | Haddad et al. |
| 5,841,700 | A | 11/1998 | Chang | 6,128,226 | A | 10/2000 | Eitan et al. |
| 5,847,441 | A | 12/1998 | Cutter et al. | 6,128,227 | A | 10/2000 | Kim |
| 5,861,771 | A | 1/1999 | Matsuda et al. | 6,130,572 | A | 10/2000 | Ghilardelli et al. |
| 5,862,076 | A | 1/1999 | Eitan | 6,130,574 | A | 10/2000 | Bloch et al. |
| 5,864,164 | A | 1/1999 | Wen | 6,133,095 | A | 10/2000 | Eitan et al. |
| 5,867,429 | A | 2/1999 | Chen et al. | 6,134,156 | A | 10/2000 | Eitan |
| 5,870,334 | A | 2/1999 | Hemink et al. | 6,137,718 | A | 10/2000 | Reisinger |
| 5,870,335 | A | 2/1999 | Khan et al. | 6,147,904 | A | 11/2000 | Liron |
| 5,875,128 | A | 2/1999 | Ishizuka et al. | 6,150,800 | A | 11/2000 | Kinoshita et al. |
| 5,877,537 | A | 3/1999 | Aoki | 6,154,081 | A | 11/2000 | Pakkala et al. |
| 5,880,620 | A | 3/1999 | Gitlin et al. | 6,156,149 | A | 12/2000 | Cheung et al. |
| 5,886,927 | A | 3/1999 | Takeuchi | 6,157,242 | A | 12/2000 | Fukui |
| RE36,179 | E | 4/1999 | Shimoda | 6,157,570 | A | 12/2000 | Nachumovsky |
| 5,892,710 | A | 4/1999 | Fazio et al. | 6,163,048 | A | 12/2000 | Hirose et al. |
| 5,903,031 | A | 5/1999 | Yamada et al. | 6,163,484 | A | 12/2000 | Uekubo |
| 5,910,924 | A | 6/1999 | Tanaka et al. | 6,169,691 | B1 | 1/2001 | Pasotti et al. |
| 5,920,503 | A | 7/1999 | Lee et al. | 6,171,909 | B1 * | 1/2001 | Ding et al. .................. 438/267 |
| 5,920,507 | A | 7/1999 | Takeuchi et al. | 6,175,523 | B1 | 1/2001 | Yang et al. |
| 5,926,409 | A | 7/1999 | Engh et al. | 6,181,597 | B1 | 1/2001 | Nachumovsky |
| 5,930,195 | A | 7/1999 | Komatsu et al. | 6,181,605 | B1 | 1/2001 | Hollmer et al. |
| 5,933,366 | A | 8/1999 | Yoshikawa | 6,185,143 | B1 | 2/2001 | Perner et al. |
| 5,933,367 | A | 8/1999 | Matsuo et al. | 6,188,211 | B1 | 2/2001 | Rincon-Mora et al. |
| 5,936,888 | A | 8/1999 | Sugawara | 6,190,966 | B1 | 2/2001 | Ngo et al. |
| 5,940,332 | A | 8/1999 | Artieri | 6,192,445 | B1 | 2/2001 | Rezvani |
| 5,946,258 | A | 8/1999 | Evertt et al. | 6,195,196 | B1 | 2/2001 | Kimura et al. |
| 5,946,558 | A | 8/1999 | Hsu | 6,198,342 | B1 | 3/2001 | Kawai |

| | | |
|---|---|---|
| 6,201,282 B1 | 3/2001 | Eitan |
| 6,201,737 B1 | 3/2001 | Hollmer et al. |
| 6,205,056 B1 | 3/2001 | Pan et al. |
| 6,205,059 B1 | 3/2001 | Gutala et al. |
| 6,208,200 B1 | 3/2001 | Arakawa |
| 6,208,557 B1 | 3/2001 | Bergemont et al. |
| 6,214,666 B1 | 4/2001 | Mehta |
| 6,215,148 B1 | 4/2001 | Eitan |
| 6,215,697 B1 | 4/2001 | Lu et al. |
| 6,215,702 B1 | 4/2001 | Derhacobian et al. |
| 6,218,695 B1 | 4/2001 | Nachumovsky |
| 6,219,277 B1 | 4/2001 | Devin et al. |
| 6,219,290 B1 | 4/2001 | Chang et al. |
| 6,222,762 B1 | 4/2001 | Guterman et al. |
| 6,222,768 B1 | 4/2001 | Hollmer et al. |
| 6,233,180 B1 | 5/2001 | Eitan et al. |
| 6,240,032 B1 | 5/2001 | Fukumoto |
| 6,240,040 B1 | 5/2001 | Akaogi et al. |
| 6,246,555 B1 | 6/2001 | Tham |
| 6,252,442 B1 | 6/2001 | Malherbe |
| 6,252,799 B1 | 6/2001 | Liu et al. |
| 6,256,231 B1 | 7/2001 | Lavi et al. |
| 6,261,904 B1 | 7/2001 | Pham et al. |
| 6,265,268 B1 | 7/2001 | Halliyal et al. |
| 6,266,281 B1 | 7/2001 | Derhacobian et al. |
| 6,272,047 B1 | 8/2001 | Mihnea et al. |
| 6,275,414 B1 | 8/2001 | Randolph et al. |
| 6,281,545 B1 | 8/2001 | Liang et al. |
| 6,282,133 B1 | 8/2001 | Nakagawa et al. |
| 6,282,145 B1 | 8/2001 | Tran et al. |
| 6,285,246 B1 | 9/2001 | Basu |
| 6,285,574 B1 | 9/2001 | Eitan |
| 6,285,589 B1 | 9/2001 | Kajitani |
| 6,285,614 B1 | 9/2001 | Mulatti et al. |
| 6,292,394 B1 | 9/2001 | Cohen et al. |
| 6,297,096 B1 | 10/2001 | Boaz |
| 6,297,143 B1 | 10/2001 | Foote et al. |
| 6,297,974 B1 | 10/2001 | Ganesan et al. |
| 6,304,485 B1 | 10/2001 | Harari et al. |
| 6,307,784 B1 | 10/2001 | Hamilton et al. |
| 6,307,807 B1 | 10/2001 | Sakui et al. |
| 6,320,786 B1 | 11/2001 | Chang et al. |
| 6,324,094 B1 | 11/2001 | Chevallier |
| 6,326,265 B1 | 12/2001 | Liu et al. |
| 6,330,192 B1 | 12/2001 | Ohba et al. |
| 6,331,950 B1 | 12/2001 | Kuo et al. |
| 6,335,874 B1 | 1/2002 | Eitan |
| 6,337,502 B1 | 1/2002 | Eitan et al. |
| 6,339,556 B1 | 1/2002 | Watanabe |
| 6,343,033 B1 | 1/2002 | Parker |
| 6,346,442 B1 | 2/2002 | Aloni et al. |
| 6,348,381 B1 | 2/2002 | Jong |
| 6,348,711 B1 | 2/2002 | Eitan |
| 6,351,415 B1 | 2/2002 | Kushnarenko |
| 6,353,356 B1 | 3/2002 | Liu |
| 6,353,554 B1 | 3/2002 | Banks |
| 6,353,555 B1 | 3/2002 | Jeong |
| 6,356,469 B1 | 3/2002 | Roohparvar et al. |
| 6,359,501 B2 | 3/2002 | Lin et al. |
| 6,374,337 B1 | 4/2002 | Estakhri |
| 6,385,086 B1 | 5/2002 | Mihara et al. |
| 6,396,741 B1 | 5/2002 | Bloom et al. |
| 6,400,209 B1 | 6/2002 | Matsuyama et al. |
| 6,400,607 B1 | 6/2002 | Pasotti et al. |
| 6,407,537 B2 | 6/2002 | Antheunis |
| 6,410,388 B1 | 6/2002 | Kluth et al. |
| 6,417,081 B1 | 7/2002 | Thurgate |
| 6,418,506 B1 | 7/2002 | Pashley et al. |
| 6,426,898 B1 | 7/2002 | Mihnea et al. |
| 6,429,063 B1 | 8/2002 | Eitan |
| 6,433,624 B1 | 8/2002 | Grossnikle et al. |
| 6,436,766 B1 | 8/2002 | Rangarajan et al. |
| 6,436,768 B1 | 8/2002 | Yang et al. |
| 6,438,031 B1 | 8/2002 | Fastow |
| 6,438,035 B2 | 8/2002 | Yamamoto et al. |
| 6,440,797 B1 | 8/2002 | Wu et al. |
| 6,442,074 B1 | 8/2002 | Hamilton et al. |
| 6,445,030 B1 | 9/2002 | Wu et al. |
| 6,449,188 B1 | 9/2002 | Fastow |
| 6,449,190 B1 | 9/2002 | Bill |
| 6,452,438 B1 | 9/2002 | Li |
| 6,456,528 B1 | 9/2002 | Chen |
| 6,456,533 B1 | 9/2002 | Hamilton et al. |
| 6,458,656 B1 | 10/2002 | Park et al. |
| 6,458,677 B1 | 10/2002 | Hopper et al. |
| 6,469,929 B1 | 10/2002 | Kushnarenko et al. |
| 6,469,935 B2 | 10/2002 | Hayashi |
| 6,472,706 B2 | 10/2002 | Widdershoven et al. |
| 6,477,085 B1 | 11/2002 | Kuo |
| 6,490,204 B2 | 12/2002 | Bloom et al. |
| 6,496,414 B2 | 12/2002 | Kasa et al. |
| 6,504,756 B2 | 1/2003 | Gonzalez et al. |
| 6,510,082 B1 | 1/2003 | Le et al. |
| 6,512,701 B1 | 1/2003 | Hamilton et al. |
| 6,519,180 B2 | 2/2003 | Tran et al. |
| 6,519,182 B1 | 2/2003 | Derhacobian et al. |
| 6,522,585 B2 | 2/2003 | Pasternak |
| 6,525,969 B1 | 2/2003 | Kurihara et al. |
| 6,528,390 B2 | 3/2003 | Komori et al. |
| 6,529,412 B1 | 3/2003 | Chen et al. |
| 6,532,173 B2 | 3/2003 | Lioka et al. |
| 6,535,020 B1 | 3/2003 | Yin |
| 6,535,434 B2 | 3/2003 | Maayan et al. |
| 6,537,881 B1 | 3/2003 | Rangarjan et al. |
| 6,538,270 B1 | 3/2003 | Randolph et al. |
| 6,541,816 B2 | 4/2003 | Ramsbey et al. |
| 6,552,387 B1 | 4/2003 | Eitan |
| 6,555,436 B2 | 4/2003 | Ramsbey et al. |
| 6,559,500 B2 | 5/2003 | Torii |
| 6,562,683 B1 | 5/2003 | Wang et al. |
| 6,566,194 B1 | 5/2003 | Ramsbey et al. |
| 6,566,699 B2 | 5/2003 | Eitan |
| 6,567,303 B1 | 5/2003 | Hamilton et al. |
| 6,567,312 B1 | 5/2003 | Torii et al. |
| 6,570,211 B1 | 5/2003 | He et al. |
| 6,574,139 B2 | 6/2003 | Kurihara |
| 6,577,514 B2 | 6/2003 | Shor et al. |
| 6,577,532 B1 | 6/2003 | Chevallier |
| 6,577,547 B2 | 6/2003 | Ukon |
| 6,583,005 B2 | 6/2003 | Hashimoto et al. |
| 6,583,479 B1 | 6/2003 | Fastow et al. |
| 6,584,017 B2 | 6/2003 | Maayan et al. |
| 6,590,811 B1 | 7/2003 | Hamilton et al. |
| 6,593,606 B1 | 7/2003 | Randolph et al. |
| 6,594,181 B1 | 7/2003 | Yamada |
| 6,608,526 B1 | 8/2003 | Sauer |
| 6,614,052 B1 | 9/2003 | Zhang |
| 6,614,295 B2 | 9/2003 | Tsuchi |
| 6,614,686 B1 | 9/2003 | Kawamura |
| 6,614,692 B2 | 9/2003 | Maayan et al. |
| 6,617,179 B1 | 9/2003 | Kim |
| 6,617,215 B1 | 9/2003 | Halliyal et al. |
| 6,618,290 B1 | 9/2003 | Wang et al. |
| 6,624,672 B2 | 9/2003 | Confaloneri et al. |
| 6,627,555 B2 | 9/2003 | Eitan et al. |
| 6,630,384 B1 | 10/2003 | Sun et al. |
| 6,633,496 B2 | 10/2003 | Maayan et al. |
| 6,633,499 B1 | 10/2003 | Eitan et al. |
| 6,633,956 B1 | 10/2003 | Mitani |
| 6,636,440 B2 | 10/2003 | Maayan et al. |
| 6,639,271 B1 | 10/2003 | Zheng et al. |
| 6,639,837 B2 | 10/2003 | Takano et al. |
| 6,639,844 B1 | 10/2003 | Liu et al. |
| 6,639,849 B2 | 10/2003 | Takahashi et al. |
| 6,642,148 B1 | 11/2003 | Ghandehari et al. |
| 6,642,573 B1 | 11/2003 | Halliyal et al. |

| | | | | | | |
|---|---|---|---|---|---|---|
| 6,642,586 | B2 | 11/2003 | Takahashi | 2003/0209767 A1 | 11/2003 | Takahashi et al. |
| 6,643,170 | B2 | 11/2003 | Huang et al. | 2003/0214844 A1 | 11/2003 | Iijima |
| 6,643,177 | B1 | 11/2003 | Le et al. | 2003/0218207 A1 | 11/2003 | Hashimoto et al. |
| 6,643,178 | B2 | 11/2003 | Kurihara | 2003/0218913 A1 | 11/2003 | Le et al. |
| 6,643,181 | B2 | 11/2003 | Sofer et al. | 2003/0222303 A1 | 12/2003 | Fukuda et al. |
| 6,645,801 | B1 | 11/2003 | Ramsbey et al. | 2003/0227796 A1 | 12/2003 | Miki et al. |
| 6,649,972 | B2 | 11/2003 | Eitan | 2004/0012993 A1 | 1/2004 | Kurihara |
| 6,650,568 | B2 | 11/2003 | Iijima | 2004/0013000 A1 | 1/2004 | Torii |
| 6,653,190 | B1 | 11/2003 | Yang et al. | 2004/0014280 A1 | 1/2004 | Willer et al. |
| 6,653,191 | B1 | 11/2003 | Yang et al. | 2004/0014290 A1 | 1/2004 | Yang et al. |
| 6,654,296 | B2 | 11/2003 | Jang et al. | 2004/0021172 A1 | 2/2004 | Zheng et al. |
| 6,664,588 | B2 | 12/2003 | Eitan | 2004/0027858 A1 | 2/2004 | Takahashi et al. |
| 6,665,769 | B2 | 12/2003 | Cohen et al. | 2004/0151034 A1 | 8/2004 | Shor et al. |
| 6,670,241 | B1 | 12/2003 | Kamal et al. | 2004/0153621 A1 | 8/2004 | Polansky et al. |
| 6,670,669 | B1 | 12/2003 | Kawamura | 2004/0157393 A1 | 8/2004 | Hwang |
| 6,674,138 | B1 | 1/2004 | Halliyal et al. | 2004/0222437 A1 | 11/2004 | Avni et al. |
| 6,677,805 | B2 | 1/2004 | Shor et al. | 2005/0020010 A1* | 1/2005 | Hsu et al. .............. 438/257 |
| 6,680,509 | B1 | 1/2004 | Wu et al. | 2005/0117395 A1 | 6/2005 | Maayan et al. |
| 6,686,242 | B2* | 2/2004 | Willer et al. .......... 438/257 | 2005/0140405 A1 | 6/2005 | Do et al. |
| 6,690,602 | B1 | 2/2004 | Le et al. | 2005/0232024 A1 | 10/2005 | Atir et al. |
| 6,700,818 | B2 | 3/2004 | Shappir et al. | 2005/0255651 A1 | 11/2005 | Qian et al. |
| 6,717,207 | B2 | 4/2004 | Kato | 2006/0084219 A1 | 4/2006 | Lusky et al. |
| 6,723,518 | B2 | 4/2004 | Papsidero et al. | 2006/0126382 A1 | 6/2006 | Maayan et al. |
| 6,731,542 | B1 | 5/2004 | Le et al. | 2006/0126383 A1 | 6/2006 | Shappir et al. |
| 6,738,289 | B2 | 5/2004 | Gongwer et al. | | | |
| 6,744,692 | B2 | 6/2004 | Shiota et al. | FOREIGN PATENT DOCUMENTS | | |
| 6,765,259 | B2 | 7/2004 | Kim | EP | 0751560 | 6/1995 |
| 6,768,165 | B1 | 7/2004 | Eitan | EP | 0693781 | 1/1996 |
| 6,781,876 | B2 | 8/2004 | Forbes et al. | EP | 0 822 557 | 2/1998 |
| 6,788,579 | B2 | 9/2004 | Gregori et al. | EP | 0 843 398 | 5/1998 |
| 6,791,396 | B2 | 9/2004 | Shor et al. | EP | 0580467 | 9/1998 |
| 6,794,249 | B2 | 9/2004 | Palm et al. | EP | 0461764 | 7/2000 |
| 6,794,280 | B2 | 9/2004 | Chang | EP | 1 071 096 | 1/2001 |
| 6,831,872 | B2 | 12/2004 | Matsuoka | EP | 1073120 | 1/2001 |
| 6,836,431 | B2 | 12/2004 | Chang | EP | 1 091 418 | 4/2001 |
| 6,871,258 | B2 | 3/2005 | Micheloni et al. | EP | 1126468 | 8/2001 |
| 6,885,585 | B2 | 4/2005 | Maayan et al. | EP | 0740307 | 12/2001 |
| 6,885,590 | B1 | 4/2005 | Zheng et al. | EP | 1164597 | 12/2001 |
| 6,912,160 | B2 | 6/2005 | Yamada | EP | 1 207 552 | 5/2002 |
| 6,917,544 | B2 | 7/2005 | Maayan et al. | EP | 1 223 586 | 7/2002 |
| 6,928,001 | B2 | 8/2005 | Avni et al. | EP | 1 365 452 | 11/2003 |
| 6,937,523 | B2 | 8/2005 | Eshel | EP | 001217744 | 3/2004 |
| 6,967,872 | B2 | 11/2005 | Quader et al. | GB | 1297899 | 11/1972 |
| 6,996,692 | B2 | 2/2006 | Kuono | GB | 2157489 | 3/1985 |
| 7,045,849 | B2* | 5/2006 | Chen et al. .............. 257/314 | JP | 54-053929 | 4/1979 |
| 7,079,420 | B2 | 7/2006 | Shappir et al. | JP | 60-200566 | 10/1985 |
| 2001/0006477 | A1 | 7/2001 | Banks | JP | 60201594 | 10/1985 |
| 2002/0000606 | A1* | 1/2002 | Eitan ...................... 257/316 | JP | 63-249375 | 10/1988 |
| 2002/0004878 | A1 | 1/2002 | Norman | JP | 3-285358 | 12/1991 |
| 2002/0004921 | A1 | 1/2002 | Muranaka et al. | JP | 04-226071 | 8/1992 |
| 2002/0064911 | A1 | 5/2002 | Eitan | JP | 04-291962 | 10/1992 |
| 2002/0132436 | A1 | 9/2002 | Eliyahu et al. | JP | 05021758 | 1/1993 |
| 2002/0140109 | A1 | 10/2002 | Keshavarzi et al. | JP | 06151833 | 5/1994 |
| 2002/0145465 | A1 | 10/2002 | Shor et al. | JP | 06-232416 | 8/1994 |
| 2002/0145914 | A1* | 10/2002 | Ogura et al. .......... 365/185.28 | JP | 07193151 | 7/1995 |
| 2002/0191465 | A1 | 12/2002 | Maayan et al. | JP | 08-106791 | 4/1996 |
| 2002/0199065 | A1 | 12/2002 | Subramoney et al. | JP | 08-297988 | 11/1996 |
| 2003/0001213 | A1 | 1/2003 | Lai | JP | 09-017981 | 1/1997 |
| 2003/0021155 | A1 | 1/2003 | Yachareni et al. | JP | 09162314 | 6/1997 |
| 2003/0072192 | A1 | 4/2003 | Bloom et al. | JP | 10-106276 | 4/1998 |
| 2003/0076710 | A1 | 4/2003 | Sofer et al. | JP | 10 334676 | 12/1998 |
| 2003/0117841 | A1 | 6/2003 | Yamashita | JP | 11-162182 | 6/1999 |
| 2003/0131186 | A1 | 7/2003 | Buhr | JP | 11-354758 | 12/1999 |
| 2003/0134476 | A1 | 7/2003 | Roizin et al. | JP | 2001-085646 | 3/2001 |
| 2003/0142544 | A1 | 7/2003 | Maayan et al. | JP | 2001-118392 | 4/2001 |
| 2003/0145176 | A1 | 7/2003 | Dvir et al. | JP | 2001-156189 | 6/2001 |
| 2003/0145188 | A1 | 7/2003 | Cohen et al. | JP | 2002-216488 | 8/2002 |
| 2003/0155659 | A1 | 8/2003 | Verma et al. | JP | 3358663 | 10/2002 |
| 2003/0190786 | A1 | 10/2003 | Ramsbey et al. | WO | WO 81/00790 | 3/1981 |
| 2003/0197221 | A1 | 10/2003 | Shinozaki et al. | WO | WO 96/15553 | 5/1996 |
| 2003/0202411 | A1 | 10/2003 | Yamada | WO | WO 96/25741 | 8/1996 |
| 2003/0206435 | A1 | 11/2003 | Takahashi | WO | WO 98/03977 | 1/1998 |
| 2003/0208663 | A1 | 11/2003 | Van Buskirk et al. | | | |

| | | |
|---|---|---|
| WO | WO 99/31670 | 6/1999 |
| WO | WO 99/57728 | 11/1999 |
| WO | WO 00/46808 | 8/2000 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/032393 | 4/2003 |
| WO | WO 03/036651 | 5/2003 |
| WO | WO 03/054964 | 7/2003 |
| WO | WO 03/063167 | 7/2003 |
| WO | WO 03/063168 | 7/2003 |
| WO | WO 03/079370 | 9/2003 |
| WO | WO 03/079446 | 9/2003 |
| WO | WO 03/083916 | 10/2003 |
| WO | WO 03/088258 | 10/2003 |
| WO | WO 03/088259 | 10/2003 |
| WO | WO 03/088260 | 10/2003 |
| WO | WO 03/088261 | 10/2003 |
| WO | WO 03/088353 | 10/2003 |
| WO | WO 03/100790 | 12/2003 |

OTHER PUBLICATIONS

Bude et al., EEPROM/Flash Sub 3.0V drain—Source Bias Hot Carrier Writing, IEDM, 1995, pp. 989-992.
Bude et al., Secondary Electron Flash—a High Performance, Low Power Flash Technology for 0.35 um and below, IEDM, 1997, 279-282.
Bude et al., Modeling Nonequilibrium Hot Carrier Device Effects, Conference of Insulator Specialists of Europe, Jun. 1997, Sweden.
Jung et al., IEEE Journal of Solid-State Circuits, Nov. 1996, 1575-1583, vol. 31, No. 11.
Campardo et al., IEEE Journal of Solid-State Circuits, Nov. 2000, 1655-1667, vol. 35, No. 11.
Lin et al., Novel Source-Controlled Self-Verified Programming for Multilevel EEPROM's, IEEE Transactions on Electron Devices, Jun. 2000, 1166-1174, vol. 47, No. 6.
Chan et al., A True Single-Transistor Oxide-Nitride-Oxide EEPROM Device, IEEE Electron Device Letters, Mar. 1987, vol. EDL-8, No. 3.
Eitan et al., "Hot-Electron Injection into the Oxide in n-Channel MOS Devices", IEEE Transactions on Electron Devices, vol. ED-28, No. 3, pp. 328-370, Mar. 1981.
Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.
Ma et al., A Dual-bit Split-Gate EEPROM (DSG) Cell in Contactless Array for Single-Vcc High Density Flash Memories, IEEE, 1994, 57-60.
Oshima et al., Process and Device Technologies for 16Mbit EPROMs with Large-Tilt-Angle Implanted P-Pocket Cell, IEEE, Dec. 1990, Ch. 2865-4/90/0000-0095, pp. 5 2 1-5 2 4, San Francisco, California.
Lee, A new approach for the floating-gate MOS nonvolatile memory, Applied Physics Letters, Oct. 1977, 475-476, vol. 31, No. 7, American Institute of Physics.
Glasser et al., MOS Device Electronics, The Design and Analysis of VLSI Circuits, Chapter 2, 67-163, 1998, Addison-Wesley Publishing Company.
Bhattacharyya et al., FET Gate Structure for Nonvolatile N-Channel Read-Mostly Memory Device, IBM Technical Disclosure Bulletin, Nov. 1975, 1768, vol. 18, No. 6.
Ricco et al., Nonvolatile Multilevel Memories for Digital Applications, Dec. 1998, 2399-2421, vol. 86, No. 12, Institute of Electrical and Electronics Engineers, Inc.
Martin, Improved Circuits for the Realization of Switched-Capacitor Filters, IEEE Transactions on Circuits and Systems, Apr. 1980, 237-244, vol. CAS-27.
Tseng et al., "Thin CVD Stacked Gate Dielectric for ULSI Technology", IEEE, pp. 321-214; 1993, 13.1.1-13.1.4.
Pickar, Ion Implementation is Silicon—Physics, Processing, and Microelectronic Devices, Applied Solid State Science, 1975, 151-241, vol. 5, Academic Press.
2 Bit/Cell EEPROM Cell Using Band-To-Band Tunneling for Data Read-Out, IBM Technical Disclosure Bulletin, 1992, 136-140, vol. 35 No. 4B.
Umezawa et al., A 5-V-Only Operation 0.6-μm Flash EEPROM with Row Decoder Scheme in Triple-Well Structure, IEEE Journal of Solid-State Circuits, 1992, 1540, vol. 27.
Mitchell et al., A new self-aligned planar array cell for ultra high density EPROMS, 1987.
Esquivel et al., High Density Contactless, Self Aligned EPROM Cell Array Technology, 1986.
Johns, Martin, Analog Integrated Circuit Design, Jun. 1, 1997, Chapter 10, John Wiley and Sons Inc.
Allen et al., CMOS Analog Circuit Design, 2002, 259 pages, Oxford University Press.
Klinke et al., A very-high-slew-rate CMOS operational amplifier, IEEE Journal of Solid-State Circuits, 1989, 744-746, 24 Vol.
Shor et al, paper WA2.04.01—Self regulated Four phased charge pump with boosted wells, ISCAS 2002.
Fotouhi, An efficient CMOS line driver for 1.544-Mb/s T1 and 2.048-Mb/s E1 applications, IEEE Journal of Solid-State Circuits, 2003, 226-236pages, 38vol.
P-N Junction Diode, Physics of semiconductor devices, 1981, Ch. 2, "A Wiley-Interscience Publication", John Wiley & Sons Publishers.
Chang, Non Volatile Semiconductor Memory Devices, Proceedings of the IEEE, 64 vol., No. 7, pp. 1039-1059; Jul. 1976.
Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.
4 Bits of Digital Data Fit in a Single Cell, Technology Newsletter, Electronic Design, Apr. 1, 1996.
M. Specht et al, Novel Dual Bit Tri-Gate Charge Trapping Memory Devices, IEEE Electron Device Letters, vol. 25, No. 12, Dec. 2004, pp. 810-812.
Bu, Jiankang et al., "Design Considerations in Scaled SONOS Nonvolatile Memory Devices" Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.
Adams et al., "SONOS Nonvolatile Semiconductor Memories for Space and Military Applications", Symposium, 2000. http://klabs.org/richcontent/MemoryContent/nvmt_symp/nvmts_2000/papers/adams_d.pdf.
"Philips Research—Technologies—Embedded Non-volatile Memories" http://research.philips.com/technologies/ics/nvmemories/index.html.
"Semiconductor Memory: Non-Volatile Memory (NVM)", National University of Singapore, Department of Electrical and Computer Engineering: http://ece.nus.edu.sg/stfpage/elezhucx/myweb/NVM.pdf.
"Saifun Non-Volatile Memory Technology", 1st Edition, 2005, published and written by Saifun Semiconductors Ltd., 1110 pgs.

* cited by examiner

NON-VOLATILE MEMORY STRUCTURE AND METHOD OF FABRICATION

CROSS-REFERENCE TO RELATED APPLICATIONS

The present application is a continuation-in-part application claiming benefit from U.S. patent application Ser. No. 11/247,733, filed Oct. 11, 2005, which application claims benefit from U.S. Provisional Patent Application 60/618,165, filed Oct. 14, 2004, which applications are hereby incorporated in their entirety by reference.

FIELD OF THE INVENTION

The present invention relates to volatile memory devices, such as nitride read only memory (NROM) cells generally and to their structure and methods of fabrication in particular.

BACKGROUND OF THE INVENTION

Dual bit memory cells are known in the art. One such memory cell is the NROM (nitride read only memory) cell 10, shown in FIG. 1A to which reference is now made, which stores two bits 12 and 14 in a nitride based layer 16, such as an oxide-nitride-oxide (ONO) stack, sandwiched between a polysilicon word line 18 and a channel 20. Channel 20 is defined by buried bit line diffusions 22 on each side which are isolated from word line 18 by a thermally grown oxide layer 26, grown after bit lines 22 are implanted. During oxide growth, bit lines 22 may diffuse sideways, expanding from the implantation area.

NROM cells are described in many patents, for example in U.S. Pat. No. 6,649,972, assigned to the common assignees of the present invention, whose disclosure is incorporated herein. As shown in FIG. 1B, to which reference is now briefly made, NROM technology employs a virtual-ground array architecture with a dense crisscrossing of word lines 18 and bit lines 22. Word lines 18 and bit lines 22 optimally can allow a 4-5 $F^2$ size cell, where F designates the design rule (i.e. minimum size of an element) of the technology in which the array was constructed. For example, the design rule for a 70 nm technology is F=70 nm. However, most NROM technologies which use the more advanced processes of less than 170 nm employ a larger cell, of 5-6 $F^{2'}$ due to the side diffusion of the bit lines.

A common problem is the integrity of bit line oxides 26. As can be seen in FIG. 1A, they are thick in a middle 25 but shrink to an "oxide beak" 27 at the sides. In general, middles 25 are of good quality but beaks 27 are of poor quality, and thus are susceptible to breakdown. Moreover, the thickness of middles 25 is sensitive to the concentration of n+ doping at the surface of bit line 22 and is thus, difficult to control. In older generation technologies, the solution to this was high temperature oxidation. However, this causes substantial thermal drive, which increases the side diffusion of bit lines 22.

Another common problem is that the NROM manufacturing process is significantly different than the periphery CMOS manufacturing process but, to create a wafer with both CMOS and NROM elements, both processes are integrated together. This affects the characterization of the CMOS transistors.

The following patents and patent applications attempt to solve these issues and to improve scaling. US 2004/0157393 to Hwang describes a manufacturing process for a non-volatile memory cell of the SONOS type which attempts to reduce or minimize the undesirable effects of small dimension components. U.S. Pat. No. 6,686,242 B2 to Willer et al. describes an NROM cell that they claim can be implemented within a 4-5 $F^2$ area. U.S. Ser. No. 11/247,733, filed Oct. 11, 2005, assigned to the common assignees of the present invention, and US 2005/255651 to Qian et al. describe further processes for manufacturing NROM cells.

Each of the above patents and patent applications utilizes a dual poly process (DPP), where a first polysilicon layer is deposited in columns between which bit lines 22 are implanted. Word lines 18 are then deposited as a second polysilicon layer, cutting the columns of the first polysilicon layer into islands between bit lines 22. In most of the above patents and patent applications, to maximize the effective length $L_{eff}$ of the channel under the first polysilicon layer, spacers, such as of oxide or of nitride, are generated next to the first polysilicon layer and the bit lines are implanted into the reduced width openings. A thermal drive is then applied and the bit lines then diffuse outwardly, towards the first polysilicon columns.

Unfortunately, some of the bit lines occasionally do not reach the first polysilicon layer. Without the overlap between the bit lines and the first polysilicon, which acts as the gate for the memory cell, the cells do not work.

SUMMARY OF THE PRESENT INVENTION

An object of the present invention is, at least, to increase the effective width $L_{eff}$ of the channel without increasing the feature size.

There is therefore provided, in accordance with a preferred embodiment of the present invention, a method for creating a non-volatile memory array. The method includes implanting pocket implants in a substrate at least between mask columns of a given width and at least through an ONO layer covering the substrate, generating increased-width polysilicon columns from the mask columns, generating bit lines in the substrate at least between the increased-width polysilicon columns and depositing oxide at least between the polysilicon columns.

Moreover, in accordance with a preferred embodiment of the present invention, generating polysilicon columns includes generating spacers to the sides of the mask columns and etching at least the first polysilicon layer between the spacers to generate the increased-width polysilicon columns.

Further, in accordance with a preferred embodiment of the present invention, the spacers are nitride or oxide.

Still further, in accordance with a preferred embodiment of the present invention, generating bit lines includes implanting the bit lines and performing a rapid thermal anneal.

Additionally, in accordance with a preferred embodiment of the present invention, the etching etches to a top layer of the ONO layer, a bottom layer of the ONO layer or the substrate.

Alternatively, in accordance with a preferred embodiment of the present invention, the etching etches to either a bottom layer of the ONO layer or the substrate and also includes depositing a protective spacer between the polysilicon columns.

Further, in accordance with a preferred embodiment of the present invention, generating the polysilicon columns also includes removing the mask columns and the spacers after the etching.

Moreover, in accordance with a preferred embodiment of the present invention, depositing the oxide occurs before removing the mask columns and the spacers. Alternatively, depositing the oxide occurs after removing the mask columns and the spacers.

Further, in accordance with a preferred embodiment of the present invention, the method includes planarizing the array to the height of the increased-width polysilicon columns and removing the mask columns and the spacers before the planarizing. Alternatively, the method includes planarizing the array to the height of the mask columns and removing the mask columns and the spacers after the planarizing.

Still further, in accordance with a preferred embodiment of the present invention, generating the polysilicon columns includes etching polysilicon between the mask columns and generating polysilicon spacers to the sides of the polysilicon columns. This embodiment may also include depositing second polysilicon on top of the planarized array, etching the second polysilicon into word lines, removing a portion of the deposited oxide between the increased-width polysilicon columns and the word lines and etching the increased-width polysilicon columns between the word lines into gates.

Further, in accordance with a preferred embodiment of the present invention, thickness of the polysilicon columns and/or the second polysilicon is at least 20 nm thick.

Additionally, in accordance with a preferred embodiment of the present invention, the non-volatile memory array is a nitride read only memory (NROM) array.

Moreover, in accordance with a preferred embodiment of the present invention, the method includes generating either a spacer or a liner after word lines are formed.

Further, in accordance with a preferred embodiment of the present invention, the method includes implanting an anti-punchthrough implant in a substrate at least between word lines.

Still further, in accordance with a preferred embodiment of the present invention, the method includes implanting an anti-punchthrough implant in a substrate between at least one of the spacer and the liner associated with the word lines.

Alternatively, in accordance with a preferred embodiment of the present invention, the method may include depositing conductive material on top of the planarized array and etching the conductive material into word lines and the polysilicon columns into gates.

There is also provided, in accordance with a preferred embodiment of the present invention, a method for creating a non-volatile memory array. This method includes depositing mask columns of a given width on a layer of polysilicon overlaying an ONO layer covering a substrate, implanting pocket implants in the substrate between the mask columns and through the polysilicon layer and the ONO layer, creating spacers to the sides of the mask columns, etching the polysilicon layer between the spacers thereby generating increased-width polysilicon columns, removing the mask columns and the spacers, generating bit lines in the substrate between the increased-width polysilicon columns and depositing oxide at least between the polysilicon columns.

There is also provided, in accordance with a preferred embodiment of the present invention, a non-volatile memory cell. The cell includes columns of channels of a given width in a semiconductor substrate, columns of junctions at the edges of the channels, columns of reduced-width diffusion bit lines between the junctions, increased-width polysilicon gates over charge trapping dielectric over the portions of the channels and overlapping at least portions of the junctions, reduced-width bit line oxides at least between the polysilicon gates and polysilicon word lines perpendicular to the columns connecting rows of the polysilicon gates.

Additionally, in accordance with a preferred embodiment of the present invention, the junctions are pocket implants.

Moreover, in accordance with a preferred embodiment of the present invention, the increased-width polysilicon gates are formed of first polysilicon and polysilicon spacers. Alternatively, the increased-width polysilicon gates are formed of first polysilicon.

Further, in accordance with a preferred embodiment of the present invention, the bit line oxides extend to a height of the polysilicon gates under the polysilicon word lines and are shorter than the height between the polysilicon word lines.

Still further, in accordance with a preferred embodiment of the present invention, the bit line oxides extend to a height above the polysilicon gates. Alternatively, the bit line oxides extend to a height of the polysilicon gates. In another embodiment, the bit line oxides next to the polysilicon gates are wider at a top thereof than at a bottom thereof.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1A:
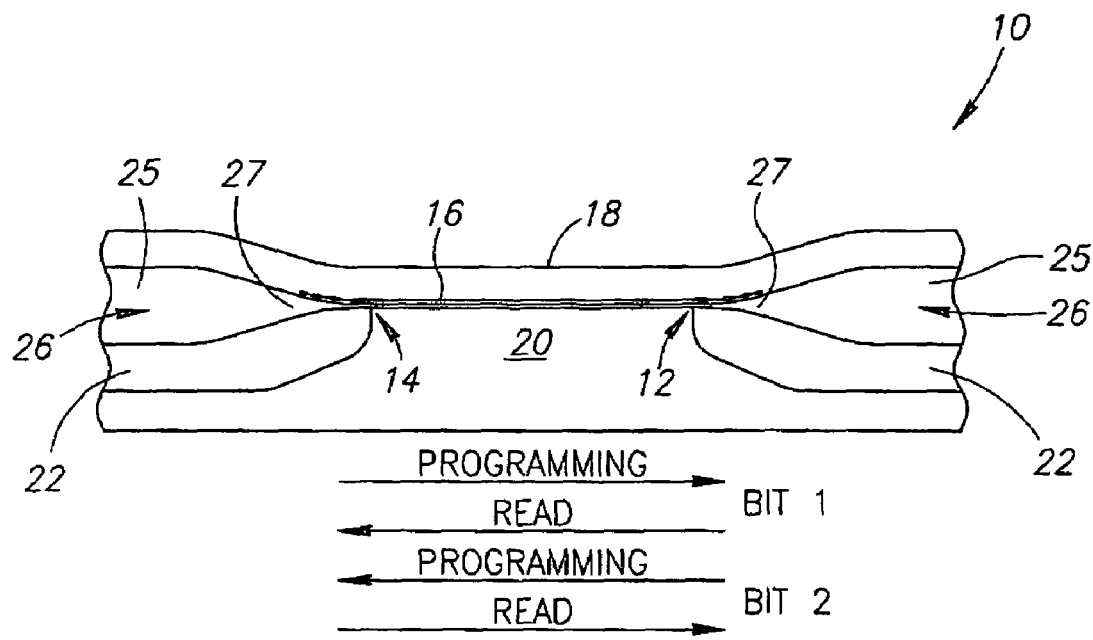
FIG. 1A is a schematic illustration of an NROM memory cell.
Figure 1B:
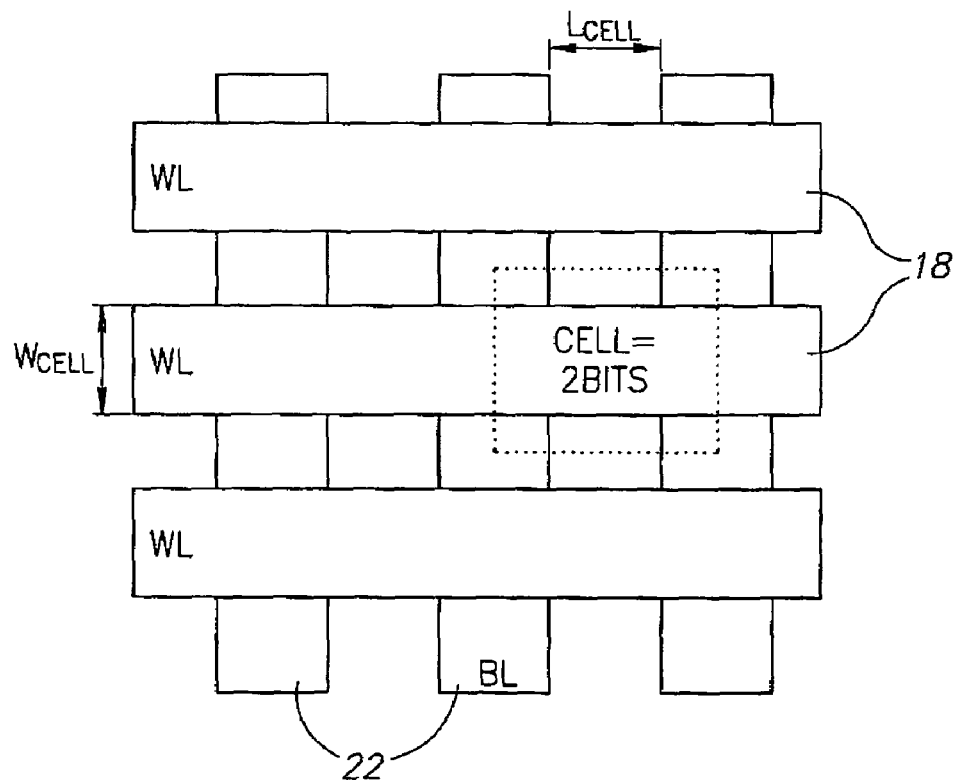
FIG. 1B is a schematic illustration of a layout of the cell of FIG. 1A.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Figure 2A:
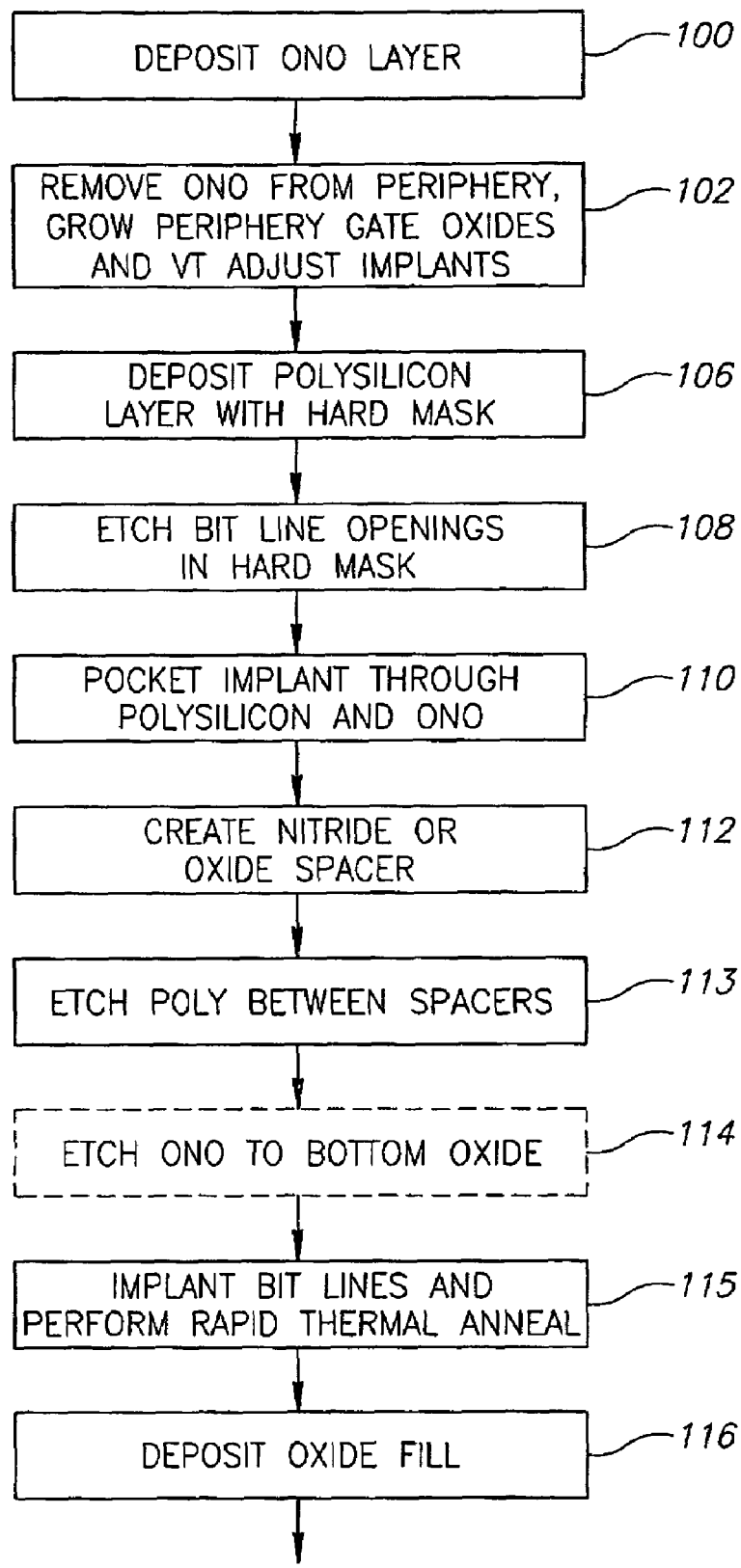
FIGS. 2A and 2B together are a flow chart illustration of a manufacturing method for a novel memory cell.
Figure 2B:
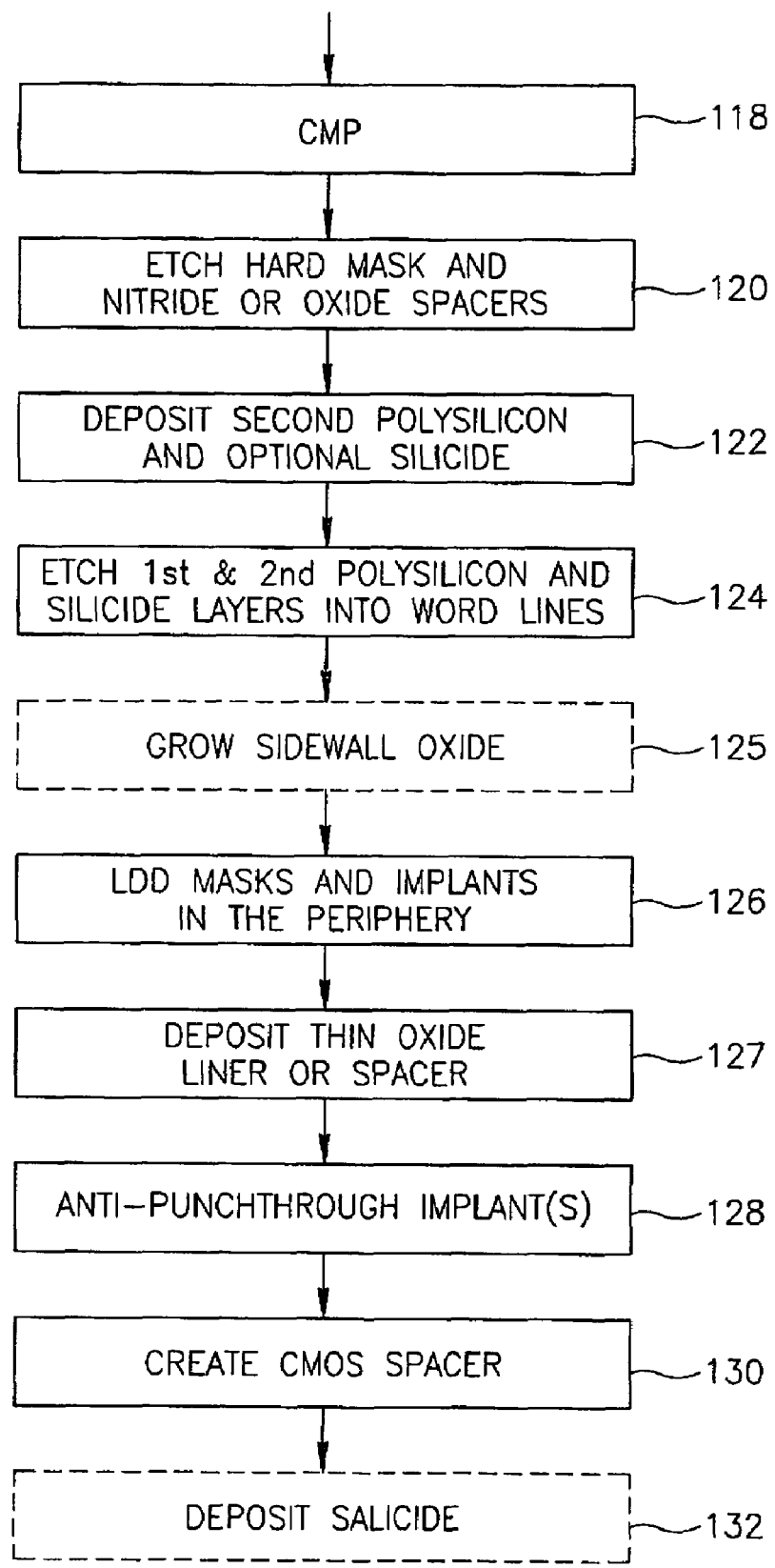

Reference is now made to FIGS. 2A and 2B, which, together, illustrate a novel process for manufacturing nitride read only memory (NROM) arrays which may attempt to ensure the presence of an overlap at the junction of the bit lines with the polysilicon gates. Reference is also made to FIGS. 3A-3I which show the results of various steps of FIG. 2 and to FIGS. 4A and 4B which show the layout of various steps of FIG. 2. As is discussed in more detail hereinbelow, the present invention may provide a smaller cell size and, with the more reliable overlap, the present invention may provide cells with increased reliability.

After preparation of a substrate 30 (FIG. 3A), an ONO layer 32 may be laid down (step 100) over the entire wafer, where, in an exemplary embodiment, the bottom oxide layer may be 3-7 mn thick, the nitride layer may be 3-7 nm thick and the top oxide layer may be 6-14 nm thick.

A mask may be laid down and the ONO layer from the periphery (e.g. area of the chip designated for CMOS operation) may be removed (step 102), after which the gate oxides of the periphery may be grown (not shown) and a threshold voltage (Vt) doping may be implanted (also not shown) for the CMOS periphery. It will be appreciated that the operations of step 102 are high thermal budget operations. Moreover, as will be seen hereinbelow, they are the last high thermal budget operations in the present process.

In step 106, a first polysilicon layer 31 may be laid down over the entire chip, covered by a hard mask 33, such as of SiON (silicon oxy-nitride) or of nitride. An exemplary first polysilicon layer 31 may be 20-100 nm thick and hard mask 33 may be 20-50 nm thick.

An etch may be performed (step 108) to generate bit line openings 37 (FIG. 3C) in hard mask 33. The etch may involve laying down a photoresist in a column pattern covering the periphery and the areas of the memory array not destined to be bit lines and then etching with an appropriate etchant. For example, a SiON etch may be used if hard mask 33 is of SiON. The etch may be set to stop at first polysilicon layer 31.

Figure 3A:
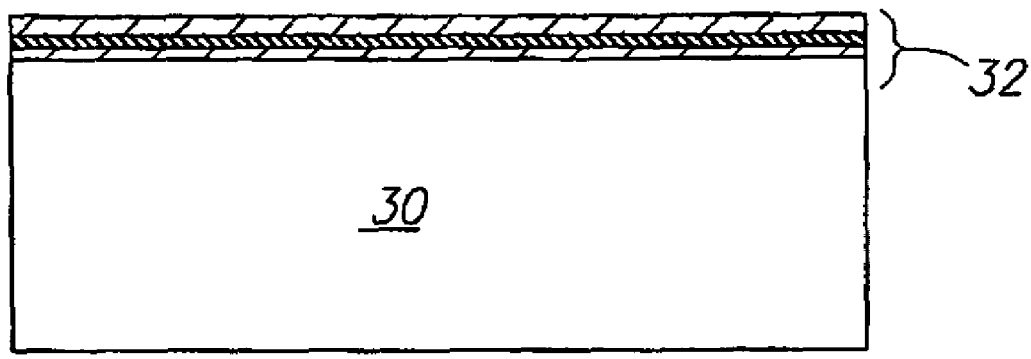
FIGS. 3A, 3B, 3C, 3D, 3E, 3F, 3G, 3H, and 3I are cross-sectional illustrations of the cell at various points during the method of FIGS. 2A and 2B.
Figure 3B:
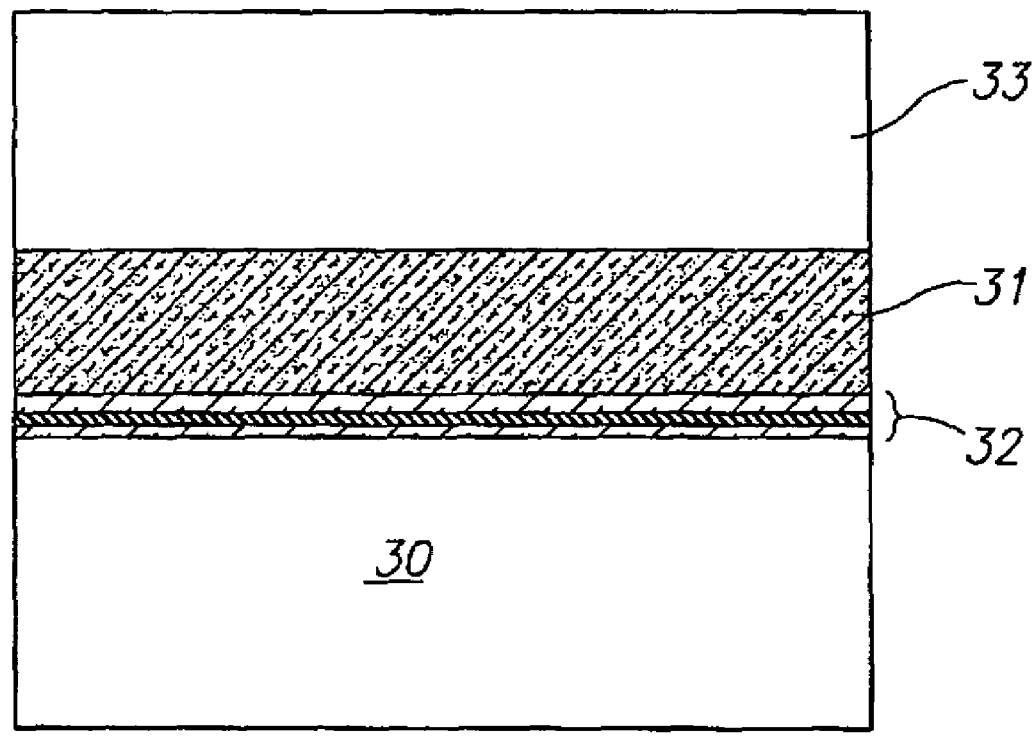
Figure 3C:
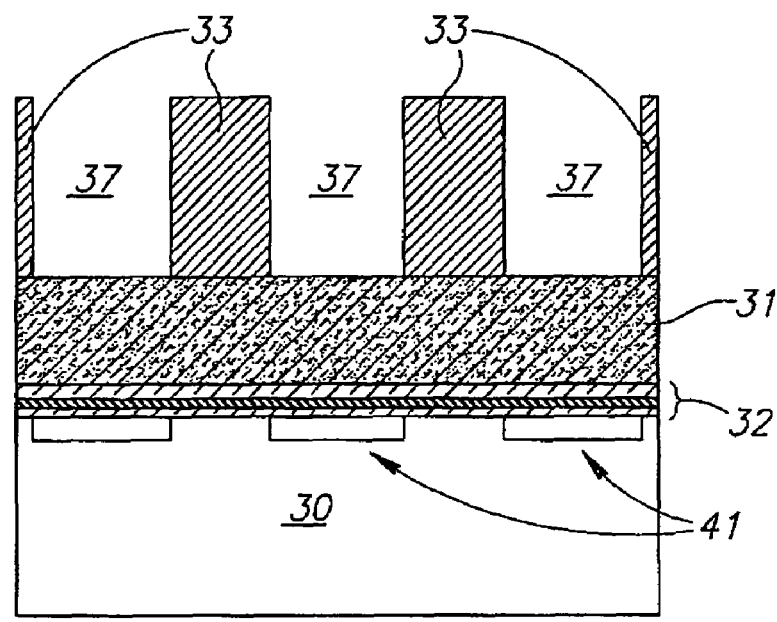

FIG. 3C shows the results of step 108. Two columns of hard mask 33 are shown on top of first polysilicon layer 31, which, in turn, is shown on top of ONO layer 32.

Pocket implants 41 may now be implanted (step 110) between mask columns 33 and through both first polysilicon layer 31 and ONO layer 32. An exemplary pocket implant may be of $1\text{-}5 \times 10^{13}/cm^2$ of Boron ($BF_2$), at an angle of 0-15°, where the angle may be limited by the width of bit line opening 37 and the height of mask 33. Part of pocket implant 41 may scatter and diffuse under mask columns 33. In an alternative embodiment, the pocket implant may be of Boron (BF2) or Indium.

Pocket implants 41 form junctions to channels 51 (FIG. 3D), which junctions are active parts of memory cells and, as discussed hereinabove, must be covered by the polysilicon gate of the cell in order for the cell to operate.

In step 112, spacers 42 may be generated on the sides of hard mask columns 33, where spacers 42 may be of nitride or oxide. Typically, such spacers may be generated by first depositing a liner, such as of 10-25 nm, and etching it with an anisotropic etch.

It will be appreciated that spacers 42 may define a mask for etching (step 113) first polysilicon layer 31 and, optionally, for etching (step 114) ONO layer 32. If no ONO etch happens, then the polysilicon etch may be set to stop on the top oxide layer. However, if step 114 happens, then the ONO etch may be set to stop at the bottom oxide, labeled 36. It may leave bottom oxide 36 or may etch a portion of it, typically leaving 2 nm.

Figure 3D:
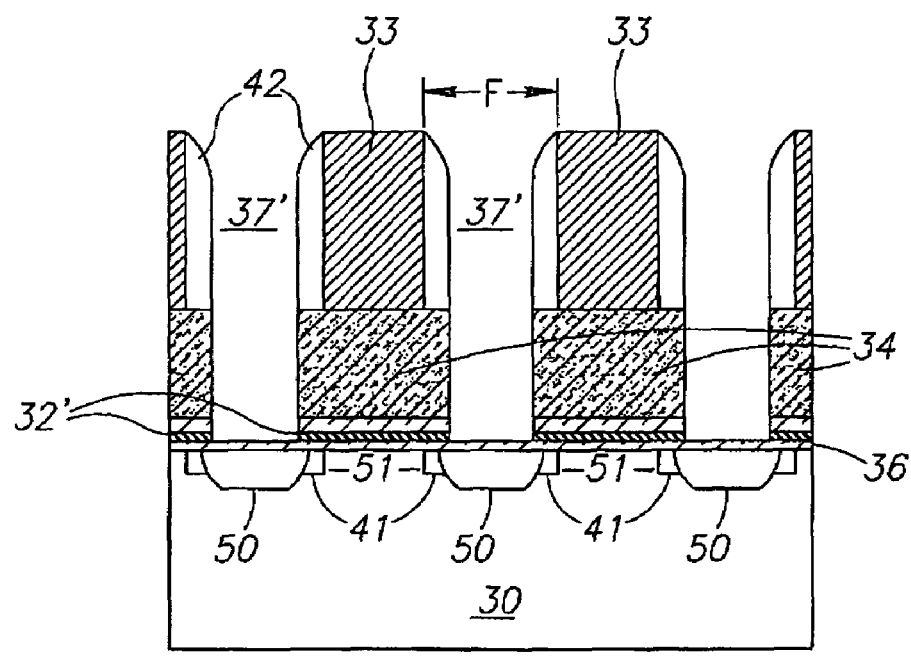

The result of steps 112, 113 and 114 may be reduced width, bit line openings, now labeled 37' in FIG. 3D. It will be appreciated that reduced width bit line openings 37' may increase the width of polysilicon columns 34 and ONO columns 32'. Moreover, it will be appreciated that, by design, increased width, polysilicon columns 34 extend over pocket implants 41 and will extend over bit lines 50 after they scatter during implantation and side diffusion, thereby ensuring that, by design, polysilicon columns 34 have an overlap with the active junction of the cell.

Bit lines 50 may be implanted (step 115) through reduced width, bit line openings 37', followed by a rapid thermal anneal (RTA). In one exemplary embodiment, the bit line implant is of Arsenic of $2 \times 10^{15}/cm^2$ at 10-20 Kev and with an angle of 0 or 7% to the bit line. During the rapid thermal anneal, bit lines 50 may diffuse deeper into substrate 30 and sideways, under ONO columns 32'.

The extent of the diffusion may depend on numerous factors. However, because bit lines 50 may be implanted between polysilicon columns 34, (rather than between oxide or nitride spacers next to polysilicon columns, as in the prior art), any diffusion of bit lines 50 will be under polysilicon columns 34. Thus, the present invention may ensure the presence in every memory cell of some overlap between the bit lines and the polysilicon gate (to be made from polysilicon columns 34 in a later step).

The ensured overlap may enable cells to be placed closer together while still maintaining the same effective length $L_{eff}$ of channel 51. In the prior art, the width W of the mask columns to define polysilicon columns 34 was the width of the desired effective channel length plus the desired amount of overlap ($W = L_{eff} + 2*overlap$). In the present invention, however, the width of hard mask 33 may be narrower, by at least the width of spacers 42, to provide the same desired effective channel length, since polysilicon columns 34 extend to the edges of implanted bit lines 50 ($W = L_{eef} + 2*overlap - 2*spacers$).

Figure 3E:
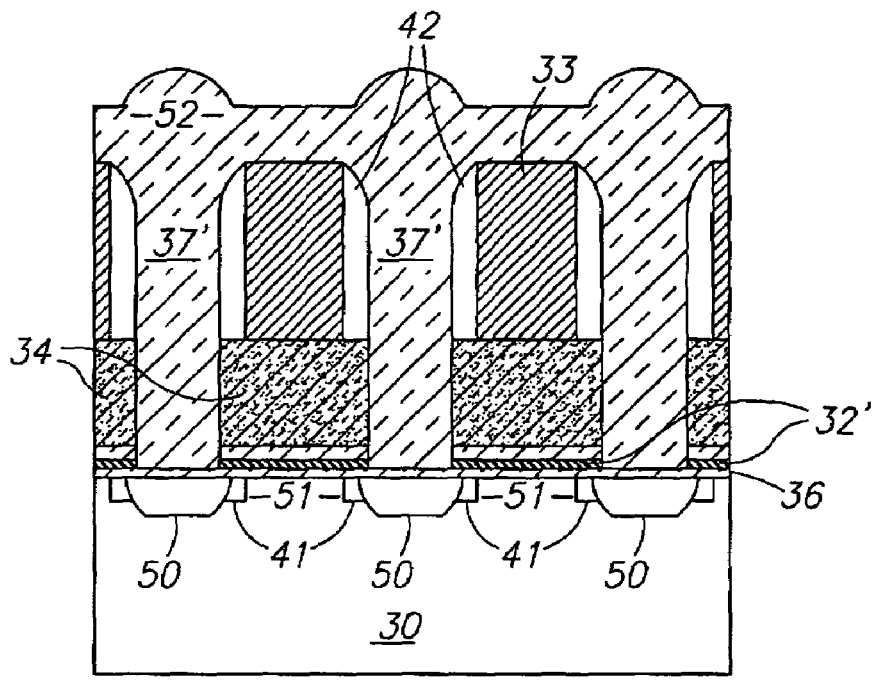
Figure 3F:
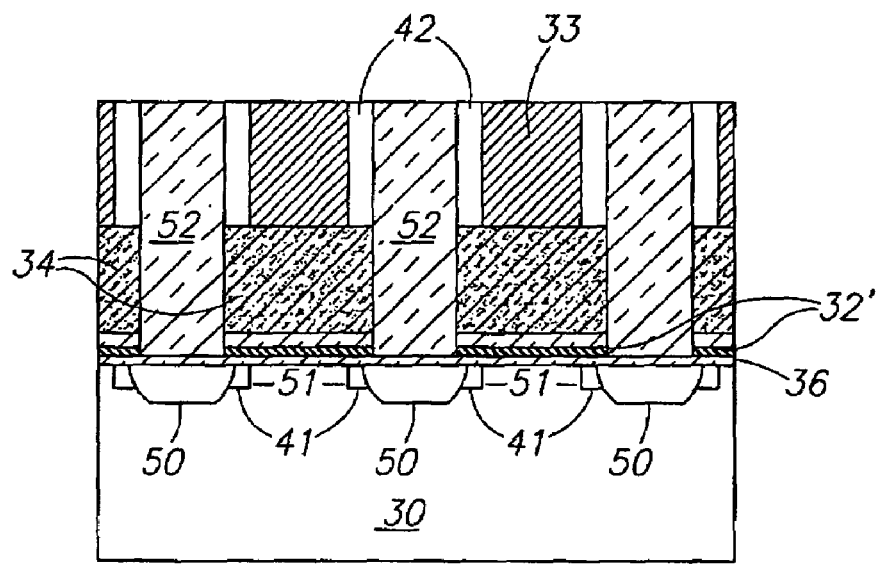

In step 116, an oxide filler 52 may be deposited on the wafer. As can be seen in FIG. 3E, oxide filler 52 may fill reduced bit line openings 37' and may also cover other parts of the wafer. In step 118, a CMP (chemical mechanical planarization) process may be performed to remove excess oxide filler 52, typically back to hard mask 33. The result of step 118 is shown in FIG. 3F.

Figure 3G:
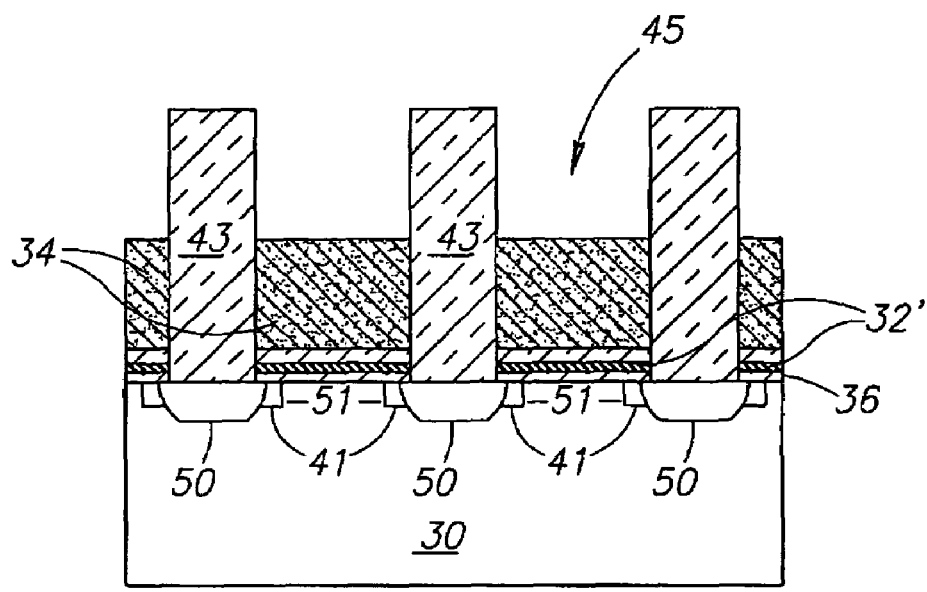

In step 120, hard mask 33 and spacers 42 may be removed from the wafer. If hard mask 33 and spacers 42 are both of nitride, then they may be etched via a nitride wet etch. If hard mask 33 and spacers 42 are of oxide, then they may be etched with an oxide etch over the entire wafer. As shown in FIG. 3G, this step may leave polysilicon columns 34 exposed between bit line oxides 43, formed of oxide filler 52 and bottom oxide 36. It will be appreciated that bit line oxides 43, which are also exposed, are formed as blocked columns with openings 45 above first polysilicon columns 34 therebetween.

Figure 3H:
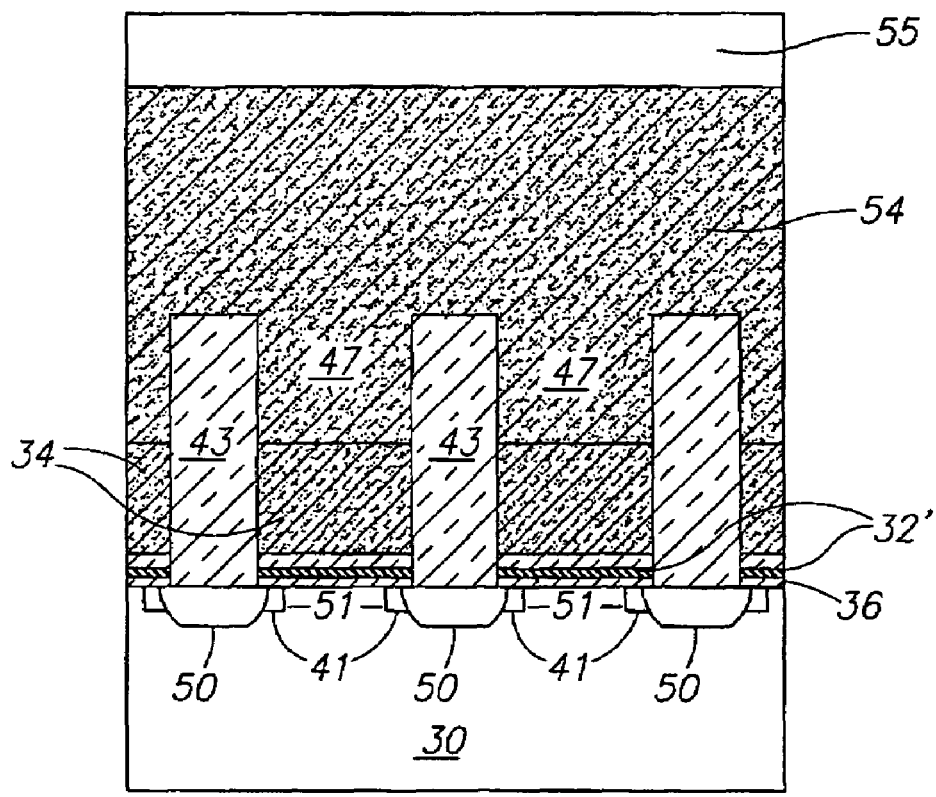

In step 122, a second polysilicon layer 54 (of 50-150 nm) and a silicide layer 55 may then be deposited (step 122) on the entire wafer. As shown in FIG. 3H, second polysilicon layer 54 may cover bit line oxides 43 and may extend, as extensions 47, into openings 45 to electrically connect to first polysilicon columns 34. Second polysilicon layer 54 may be coated with silicide layer 55.

Layers 34, 54 and 55 may then be etched (step 124) into word lines 56 (FIG. 3I), which may be in rows perpendicular to the bit line columns. To etch the word lines, another hard mask may first be deposited over silicide layer 55, followed by an etch of the hard mask, silicide layer 55, second polysilicon layer 54 and first polysilicon columns 34. The etch may continue into one or more of the ONO layers 32 or not, as desired.

Figure 3I:
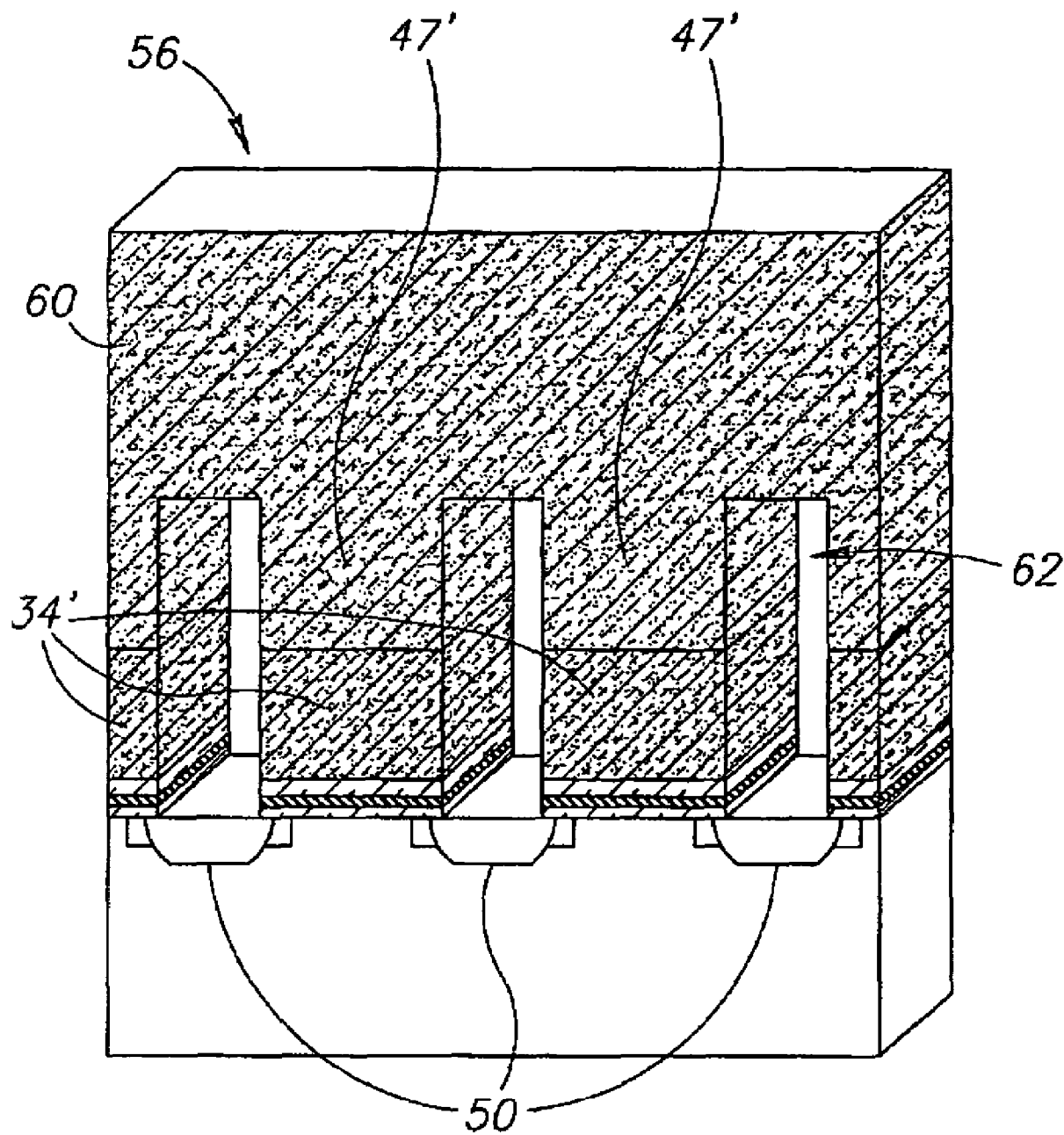

FIG. 3I shows one word line 56. It is a row 60 having a plurality of gates 62, where each gate 62 stands on an ONO column 32'. Each gate 62 may comprise a gate 34' of first polysilicon and an extension 47' of second polysilicon. For clarity, FIG. 3I does not show bit line oxides 43 between gates 62.

It will be appreciated that polysilicon gates 62 overlap bit lines 50, irrespective of any variation in side diffusion of bit lines 50. Moreover, bit line oxides 43 may be blocked and self-aligned to polysilicon gates 62. Furthermore, word lines 56 may extend above and perpendicular to buried diffusion bit lines 50, which may be insulated from them by blocked bit line oxides 43.

In another embodiment, the step of depositing silicide layer 55 may be replaced with a much later salicide (self aligned silicidation) process (step 132)

Figure 4A:
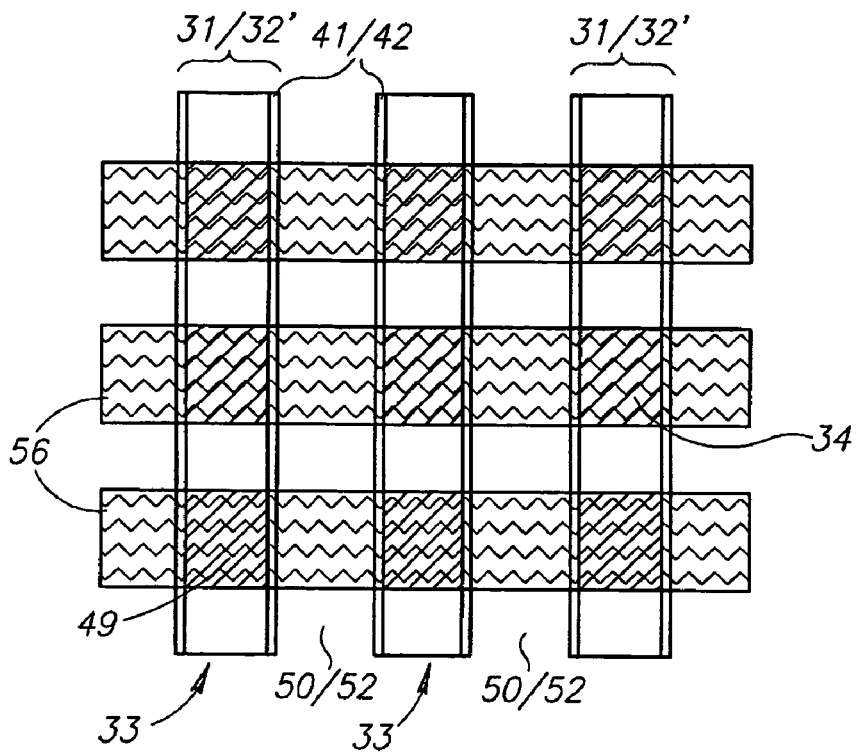
FIGS. 4A and 4B are top view illustrations of a memory array manufactured by the method of FIGS. 2A and 2B.
Figure 4B:
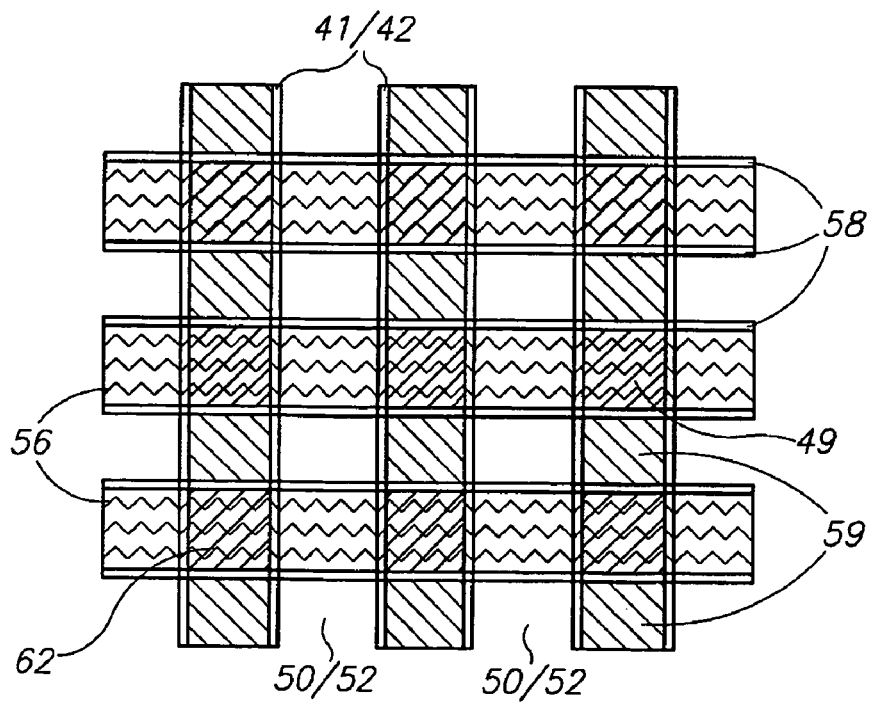

The layout of the array may be seen more clearly in FIG. 4A. As can be seen, hard mask 33 may be laid out in columns with spacers 42 to their sides. Pocket implant 41 may be present at least under spacers 42. Due to the scattering and side diffusion of pocket implant 41, the edge of pocket implant 41 may also have a tail (not shown) under the area defined by hard mask 33. First polysilicon columns 34 and ONO columns 32' may have a width equivalent to the combined width of mask 33 and spacers 42.

Bit lines 50 may be implanted between the columns and may be covered by oxide filler 52. Once hard mask 33 may be removed, word lines 56 may be laid out in rows, extending into the columns between bit lines 50. As can be seen, when word lines 56 may be etched, the polysilicon between rows 56 may be etched, leaving polysilicon gates 62, formed of first and second polysilicon.

Gates 62 may form the gates of each NROM cell and they are connected together in a row via rows 60. In addition, polysilicon layers 34 and 54 may form the gates, and possibly some interconnections, in the CMOS periphery.

A sidewall oxide 58 (FIG. 4B) may optionally be generated (step 125) to cover the word line surfaces that may be exposed as a result of etch step 124.

In step 126, lightly doped drain (LDD) implants for the CMOS transistors may be implanted. There is typically one mask for the n-LDD implants (for n-channel devices) and another mask for the p-LDD implants (for p-channel devices). Both implants may be of $1\text{-}5\times10^{13}/cm^2$.

A thin oxide liner or partial spacer, of about 10-20 nm, may then be deposited (step 127), along and between word lines 56. This liner may serve as part of the CMOS spacer and may be completed after implanting of an anti-punchthrough implant 59 (step 128). However, if salicidation of word lines 56 is desired (as shown in step 132), an oxide spacer may be preferred in order to remove the oxide covering word lines 56 and to enable word lines 56 to be salicidized.

In step 128, an anti-punchthrough implant 59 may be generated in the spaces between bit lines 50 not covered by word lines 56. An exemplary anti-punchthrough implant may be of Boron (B) of 15 Kev at $5\times10^{12}/cm^2$ or 30 Kev at $3\times10^{12}/cm^2$. Alternatively, the anti-punchthrough implant may comprise a multiplicity of implants with different energies and doses in the same location. For example, there might be three consecutive implants of Boron, of $5\times10^{12}$ at 15 Kev, $3\times10^{12}$ at 25 Kev and $3\times10^{12}$ at 35 Kev. Alternatively, the Boron may be replaced by BF2 or Indium.

Finally, oxide spacers may be created (step 130) for the transistors in the CMOS periphery. The spacers may cover the entire wafer and may fill or partially fill between word lines 56, providing an insulation between word lines 56. In step 132, a salicide process (i.e. self-aligned silicidation), such as is known in the art, may be optionally performed on the chip if second polysilicon layer 54 was not covered with silicide layer 55. This process may cause salicidation of the polysilicon throughout the chip which may reduce the resistances of the word lines and of the CMOS junctions.

Figure 5A:
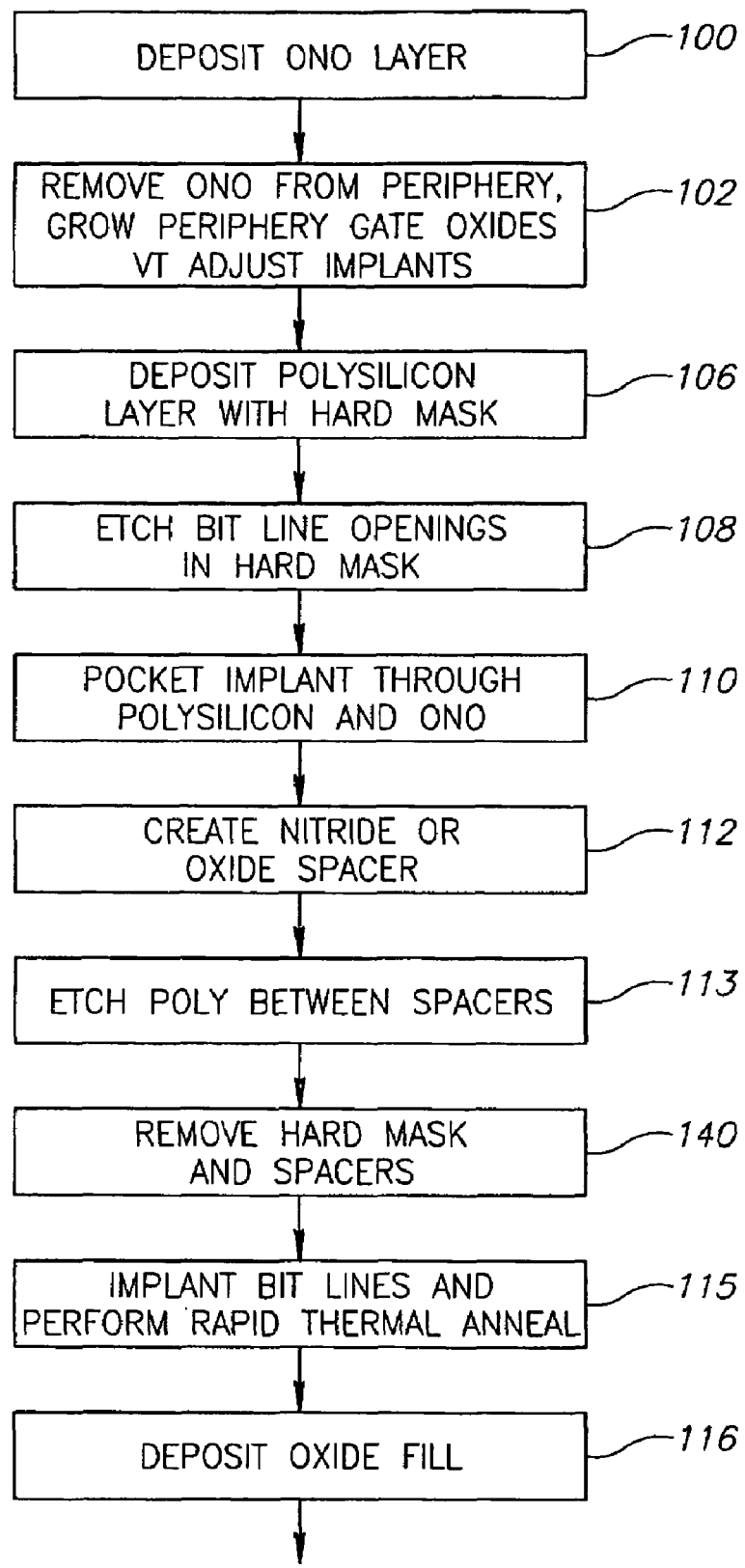
FIGS. 5A and 5B together are a flow chart illustration of an alternative method to that of FIGS. 2A and 2B.
Figure 5B:
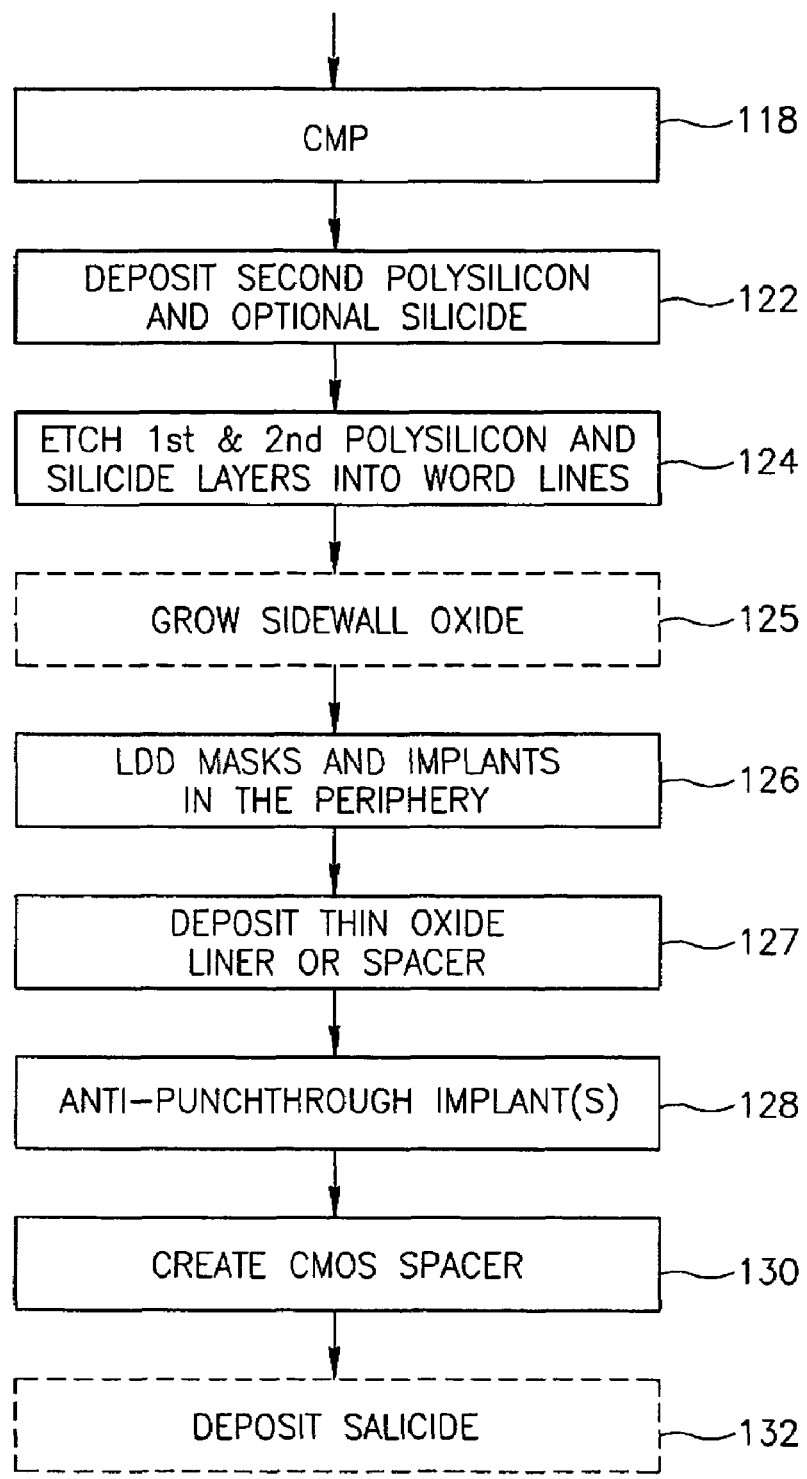
Figure 6:
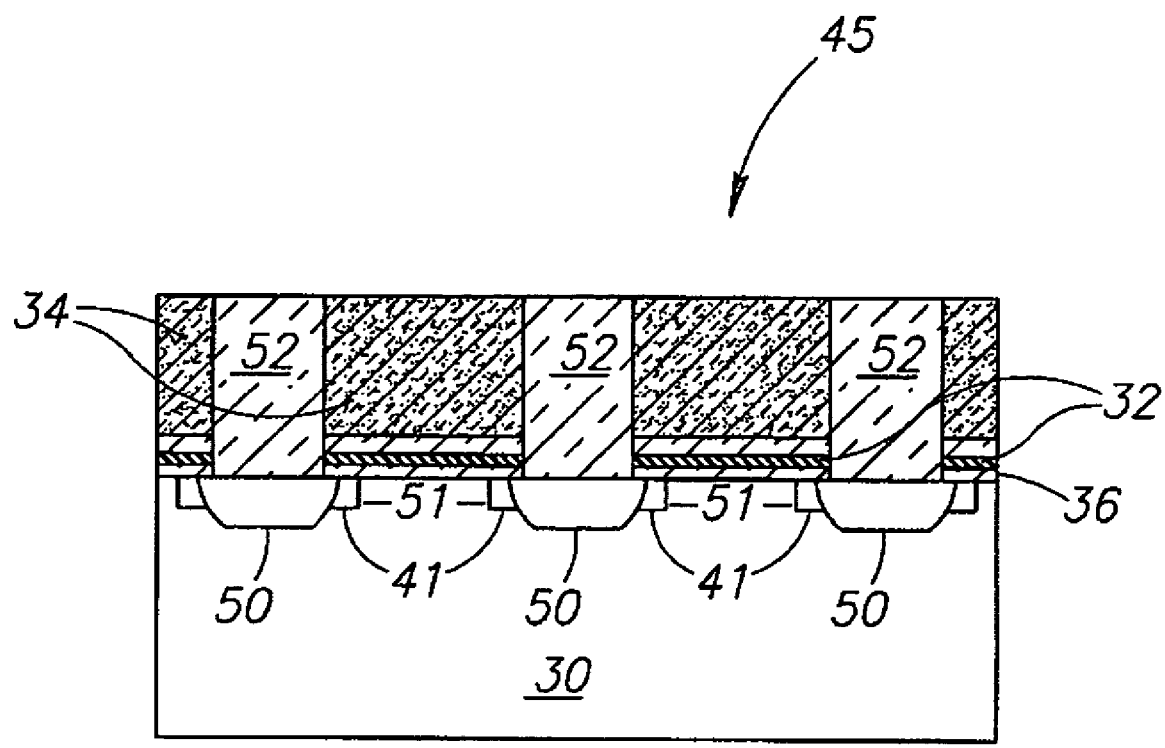
FIG. 6 is a graphical illustration of the cell at one point during the method of FIGS. 5A and 5B.

Reference is now made to FIGS. 5A and 5B, which illustrate an alternative embodiment of the method of the present invention and to FIG. 6, which may illustrate the array after the CMP step 118. In this embodiment, steps 100-112 remain the same. However, the polysilicon etch of step 113 may be set to leave most of the top oxide layer intact and a step 140 may be added to remove hard mask 33 and spacers 42 before the implantation (in step 115) of bit lines 50. As a result and as shown in FIG. 6, CMP step 118 may trim bit line oxide 52 back to the height of polysilicon columns 34, rather than to the combined height of polysilicon columns 34 and hard mask 33, as in FIG. 3G of the previous embodiment.

Figure 7A:
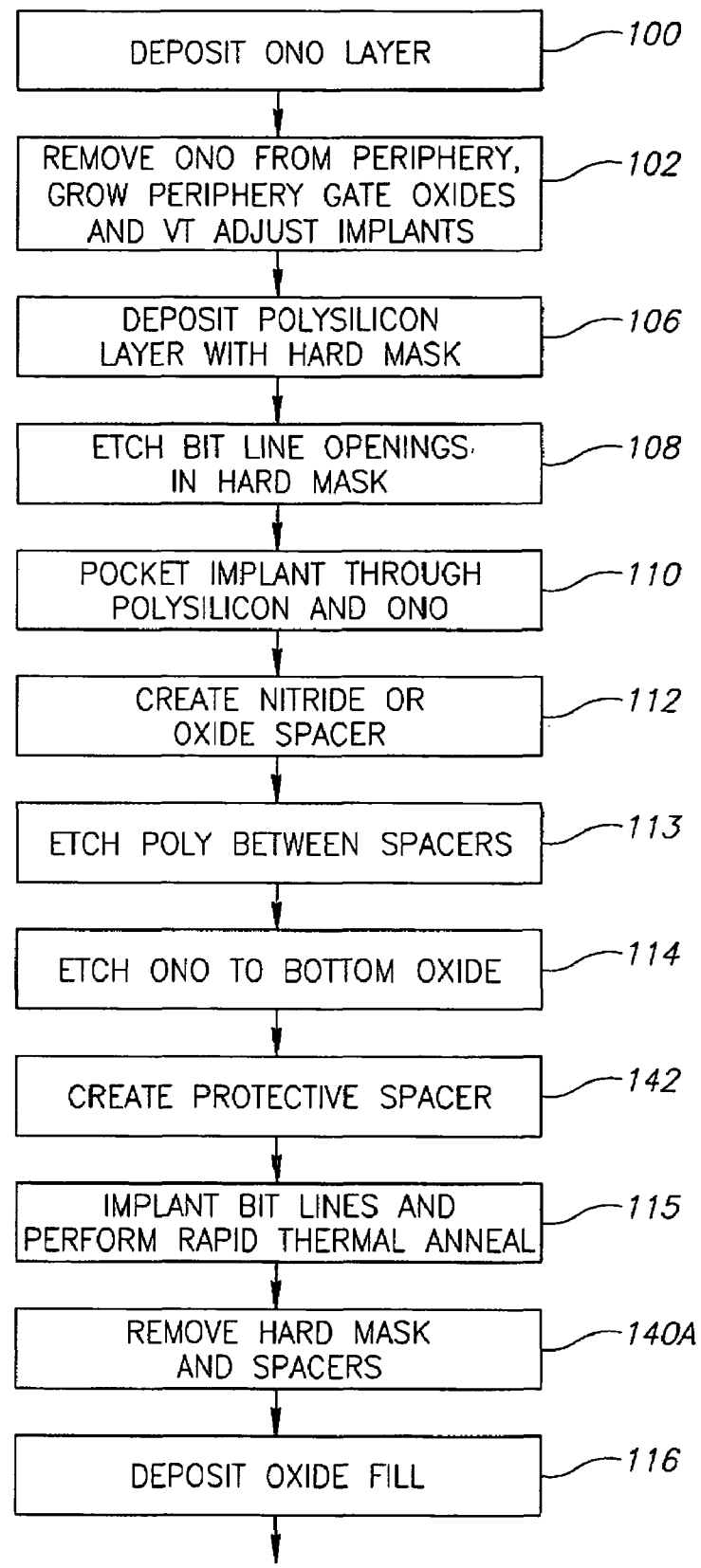
FIGS. 7A and 7B together are a flow chart illustration of a further alternative method to that of FIGS. 2A and 2B.
Figure 7B:
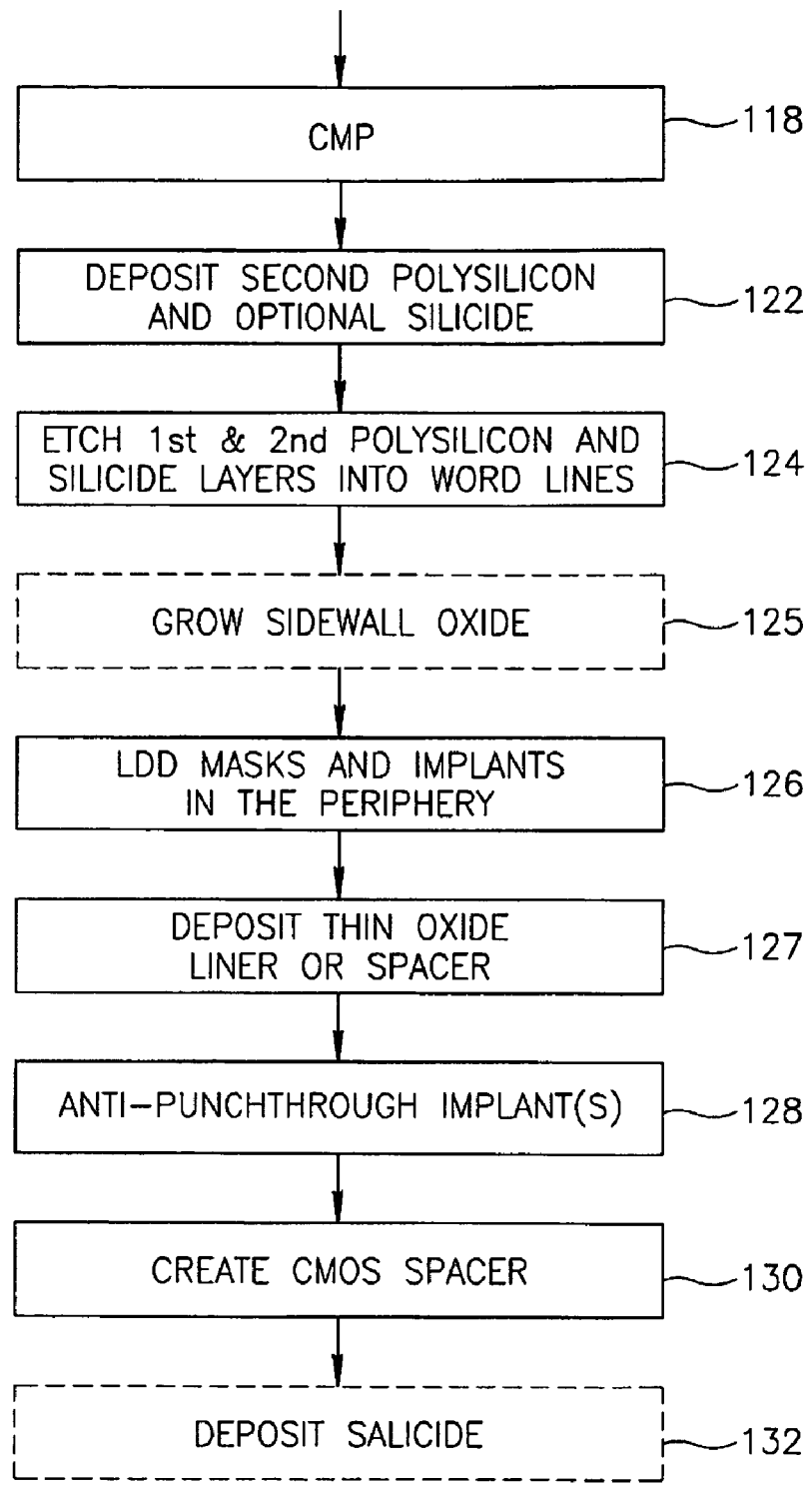
Figure 8:
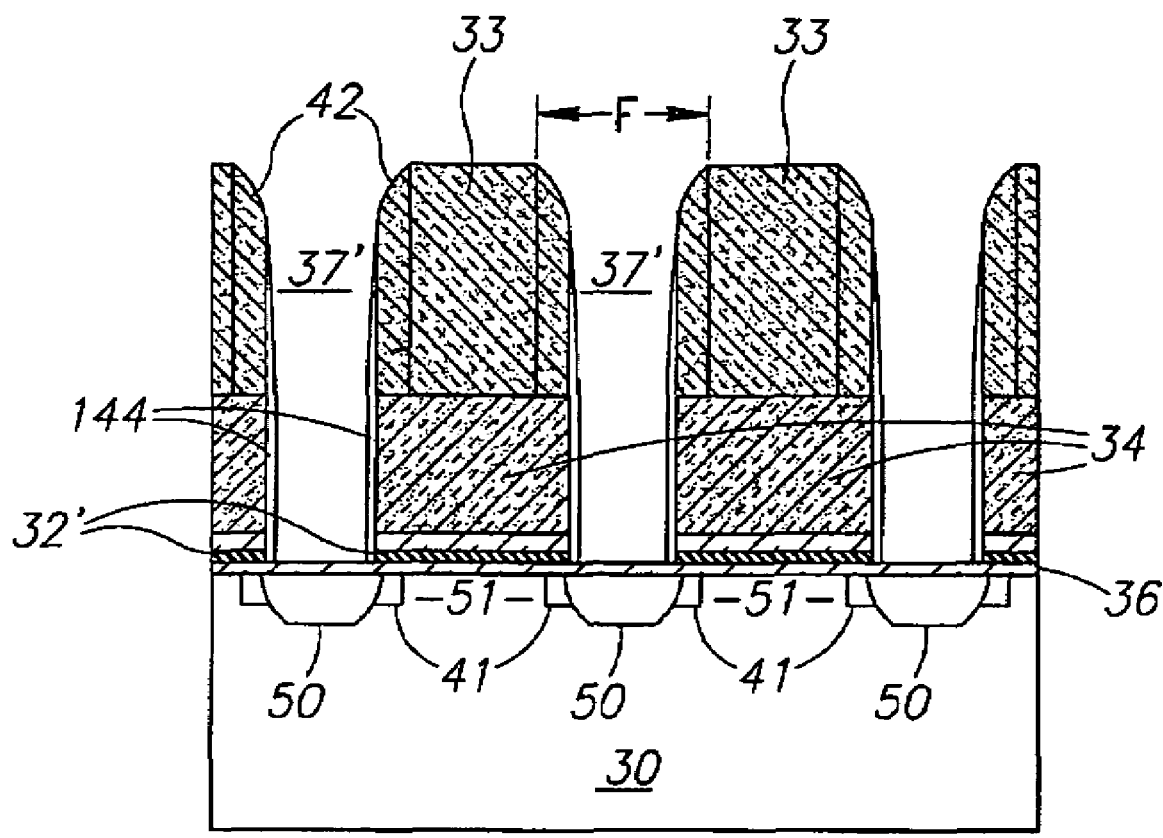
FIG. 8 is a cross-sectional illustration of the cell at one point during the method of FIGS. 7A and 7B.

Reference is now made to FIGS. 7A and 7B, which illustrate a further alternative embodiment of the method of the present invention and to FIG. 8, which may illustrate the array after the addition of a protective spacer 144. In this embodiment, steps 100-112 remain the same. However, there are two etch steps, as in the first embodiment of FIG. 2A, a polysilicon etch (step 113) and an ONO etch (step 114) to bottom oxide 36.

In order to protect the edge of the nitride layer from removal during the removal of hard mask 33, which, in this embodiment is of nitride, a protective oxide spacer 144 may be created (step 142). Spacer 144 may be relatively thin, such as of 5-8 nm, and may create a slightly smaller bit line opening 37' for implantation and rapid thermal anneal (step 115) of bit lines 50. Spacer 144 may also be used to optimize the overlap of pocket implants 41 to bit lines 50 for better control of the punchthrough and reliability of the device.

After the implantation, hard mask 33 and spacers 42 may be removed (step 140A), leaving oxide spacers 144, after which oxide may be deposited (step 116) to fill bit line openings 37'. Oxide spacers 144 may become part of bit line oxides 43 covering bit lines 50. CMP step 118 may trim oxide fill 52 and oxide spacers 144 back to the height of polysilicon columns 34.

Figure 9A:
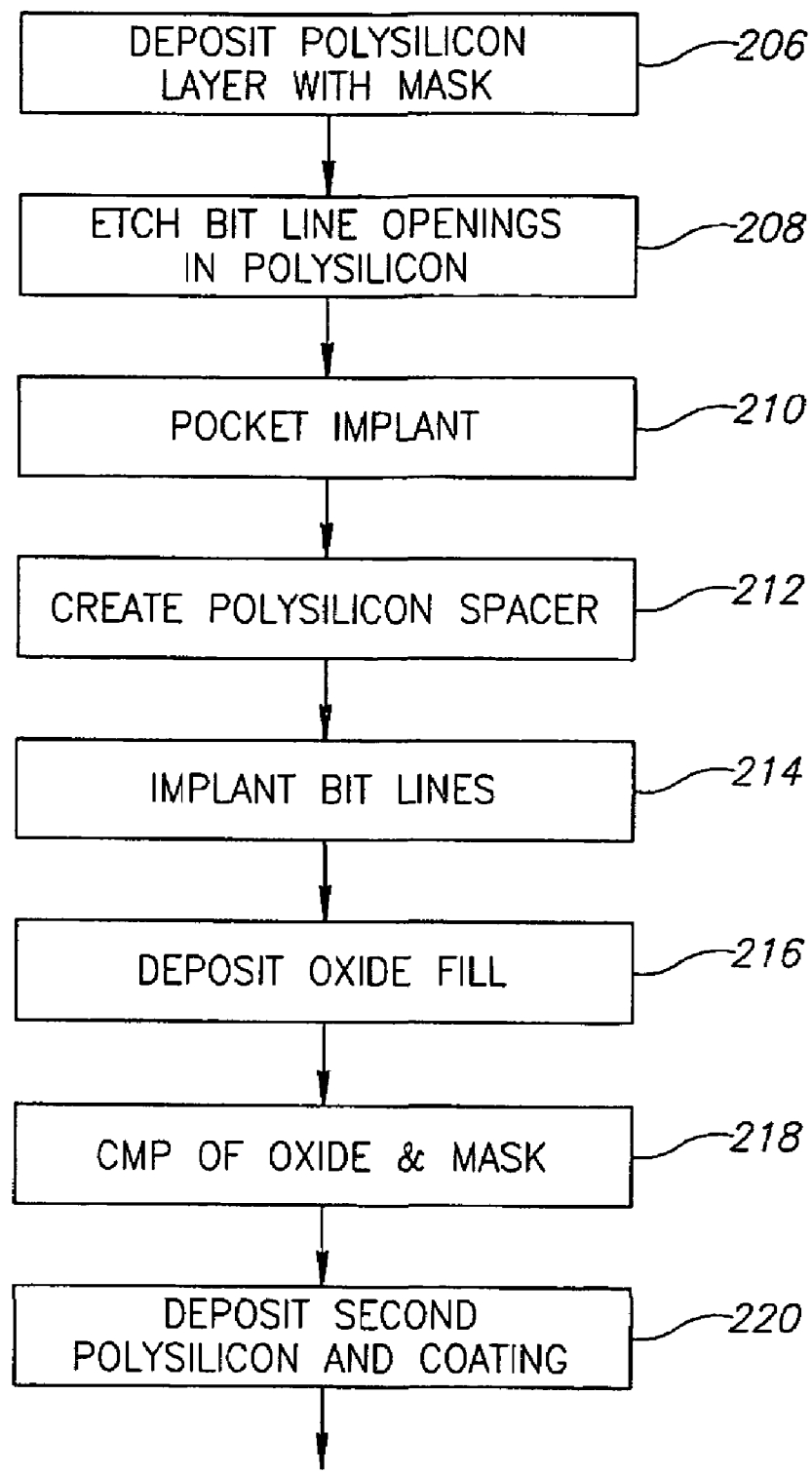
FIGS. 9A and 9B together are a flow chart illustration of another manufacturing method for a novel memory cell.
Figure 9B:
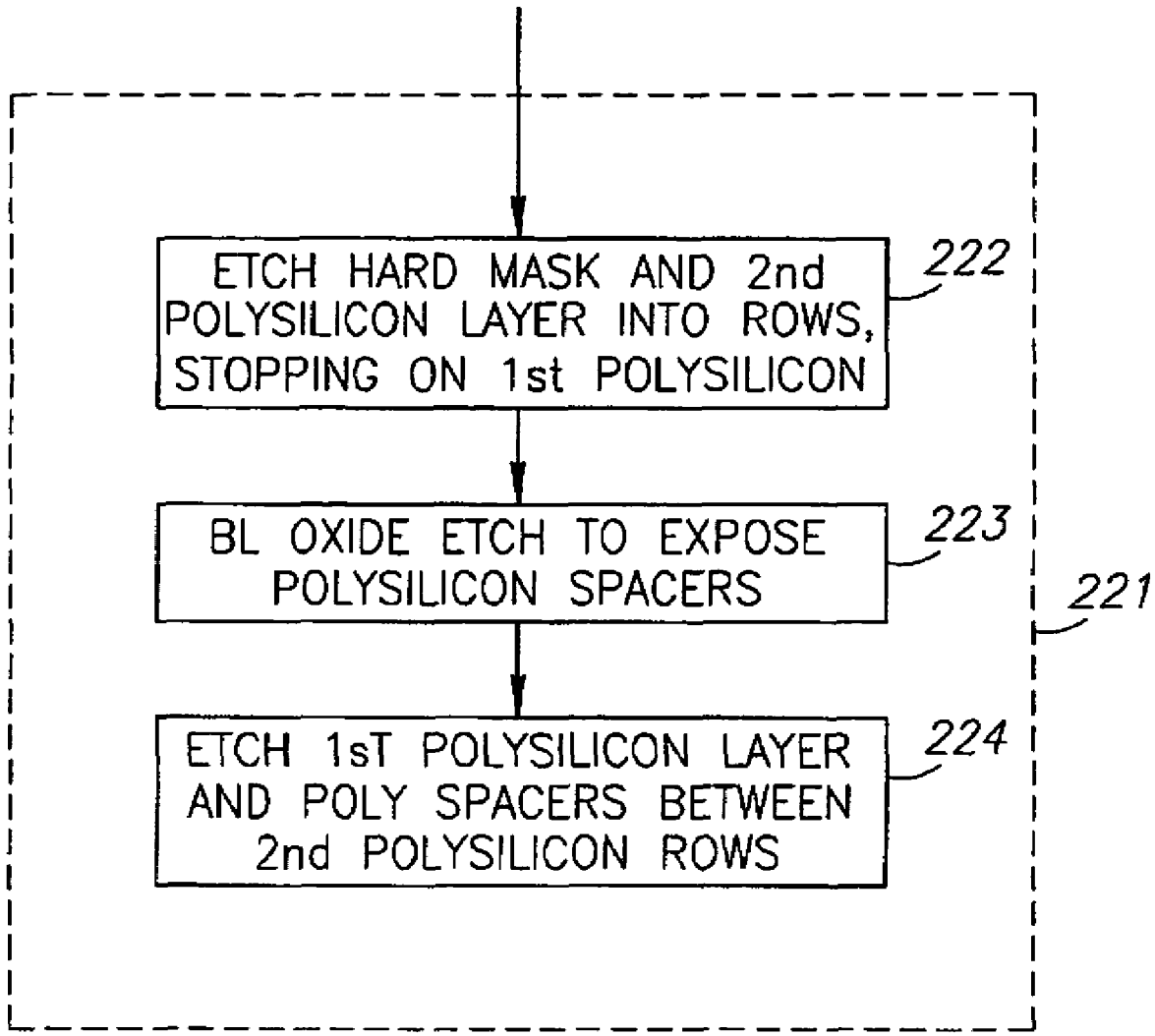

Reference is now made to FIGS. 9A and 9B, which illustrate an alternative embodiment of the present invention also providing a super-lithographic width polysilicon layer. Reference is also made to FIGS. 10A-10D which show the results of various steps of FIG. 9A and to FIGS. 11A-11C, which show the results of the word line etch of FIG. 9B.

The first steps of this embodiment are similar to steps 100-102 of the previous embodiment.

Figure 10A:
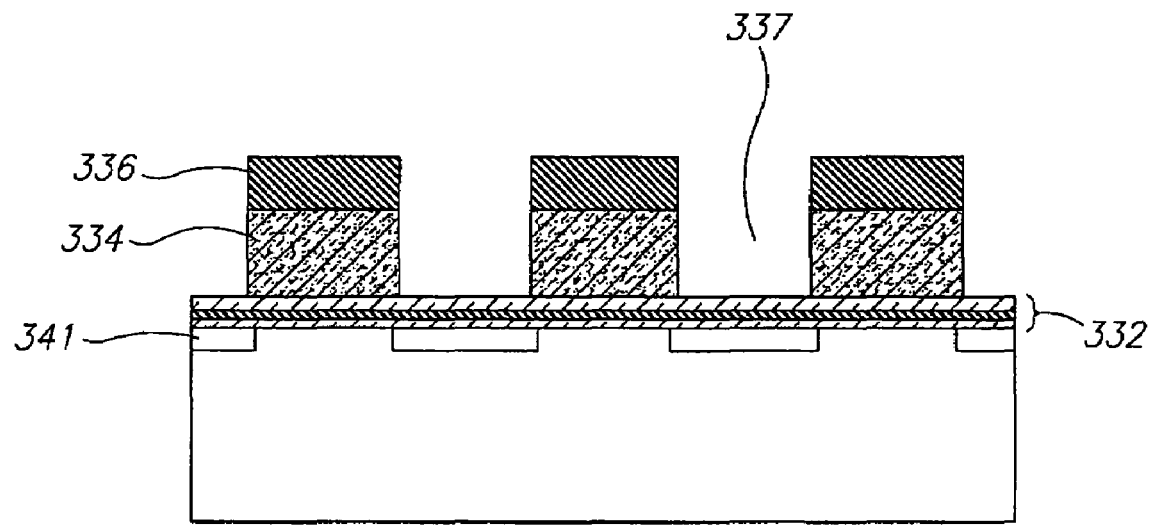
FIGS. 10A, 10B, 10C and 10D are cross-sectional illustrations of the cell at various points during the method of FIGS. 9A and 9B.

In step 206, a first polysilicon layer may be laid down over the entire chip as in the first embodiment. A SiON (silicon oxynitride) or nitride hard mask 336, of 20-50 nm, may then be deposited in a column pattern covering the areas of the memory array not destined to be bit lines. An etch may be performed (step 208) to generate bit line openings 337 by removing the areas of polysilicon layer between columns of hard mask layer 336. The etching step typically may remove polysilicon and may be set to remove none or a minimum of the top layer of ONO layer 332. FIG. 10A shows the results of the etch process for one embodiment of the present invention. Two columns 334 of polysilicon and hard mask 336 are shown on top of ONO layer 332.

A pocket implant 341, as in the previous embodiment, may now be implanted (step 210) between polysilicon columns 334 and through ONO layer 332.

Figure 10B:
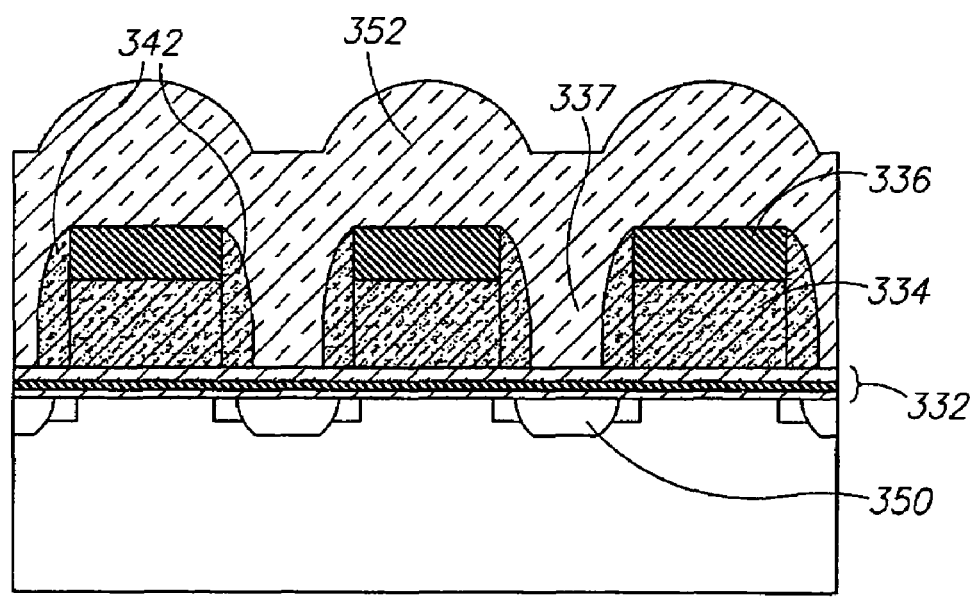
Figure 10C:
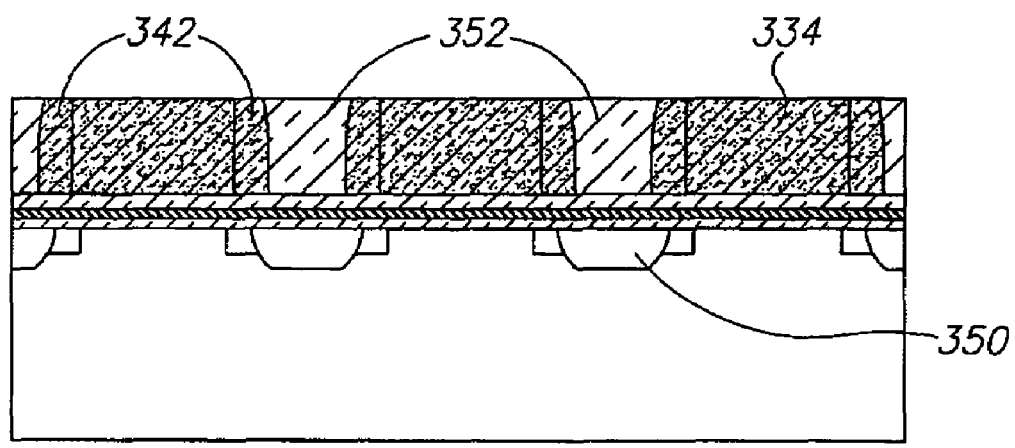

In step 212, polysilicon spacers 342 may be generated on the sides of polysilicon columns 334 to decrease the width of bit line openings, labeled 337' in FIG. 10B. Polysilicon spacers 342 may be formed by depositing polysilicon in bit line openings 337 and then etching them back anisotropically with a polysilicon etch. The etch may be set to stop on either the top or the bottom oxide of ONO layer 332. FIG. 10B shows the first embodiment, with no etching of ONO layer 332.

Once spacers 342 have been formed, bit lines 350 may be implanted (step 214), as in the previous embodiment, within reduced bit line openings 337'. In step 216, an oxide filler 352 may be deposited on the chip to fill reduced bit line openings 337' and may cover other parts of the chip.

It will be appreciated that polysilicon spacers 342 may cover pocket implants 341 and may provide an overlap of the gate (to be formed from polysilicon column 334 and polysilicon spacers 342) over the junction In step 218, a CMP process may be performed to remove the excess oxide filler 352 as well as hard mask 336 and a top portion 341 of spacer 342 from the top of the chip. The result of step 218 is shown as a sectional view in FIG. 10C. As can be seen, the planarization may be designed to remove material until it reaches the top of polysilicon 334.

Figure 10D:
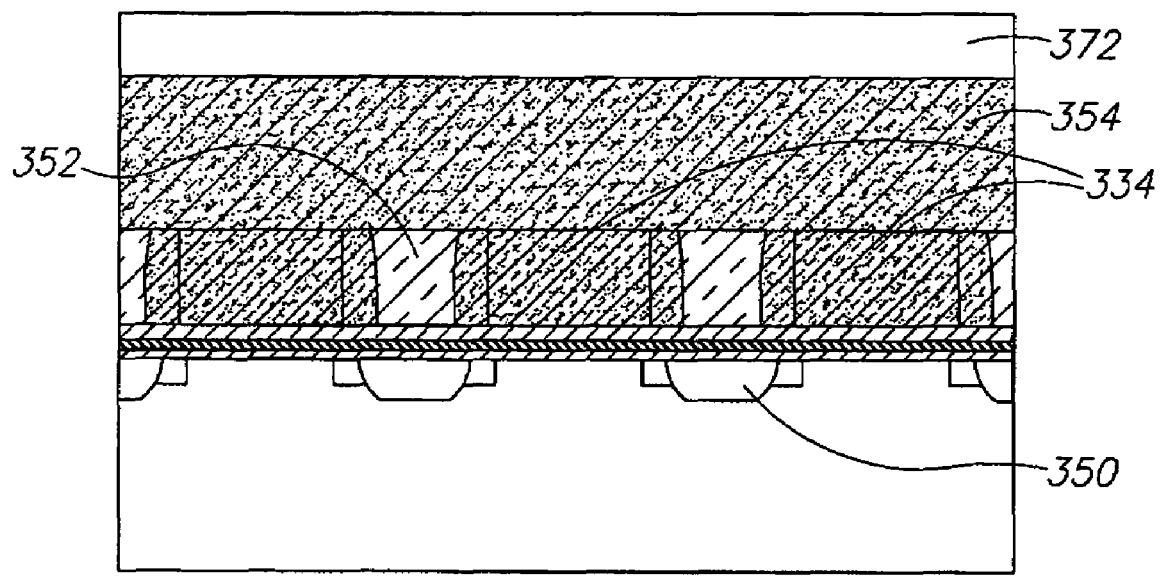

A second polysilicon layer 354 and a coating 372 of SiON may then be deposited (step 220) on the array. The result of step 220 is shown in FIG. 10D. SiON 372 and second polysilicon 354 may now be etched (step 221) into word lines, which, as in the previous embodiment, may be in rows perpendicular to the bit line columns. It will be appreciated that the word line etch operation (step 221) must etch through SiON coating 372, second polysilicon 354, first polysilicon 334 and polysilicon spacer 342, down to ONO layer 332.

Since polysilicon spacers 342 may be at least partially covered by the oxide filler, otherwise known as "bit line oxide" 352, step 221 may be divided into three etch operations, a first etch (step 222) of SiON coating 372 and second polysilicon 354, a bit line oxide etch (step 223) to expose the rounded edges of polysilicon spacer 342 and a second polysilicon etch (step 224) to etch both the first polysilicon layer 334 and polysilicon spacers 342 into islands. The results of steps 222, 223 and 224 are shown in FIGS. 11A, 11B and 11C, respectively, which are expanded, isometric views of the array.

Figure 11A:
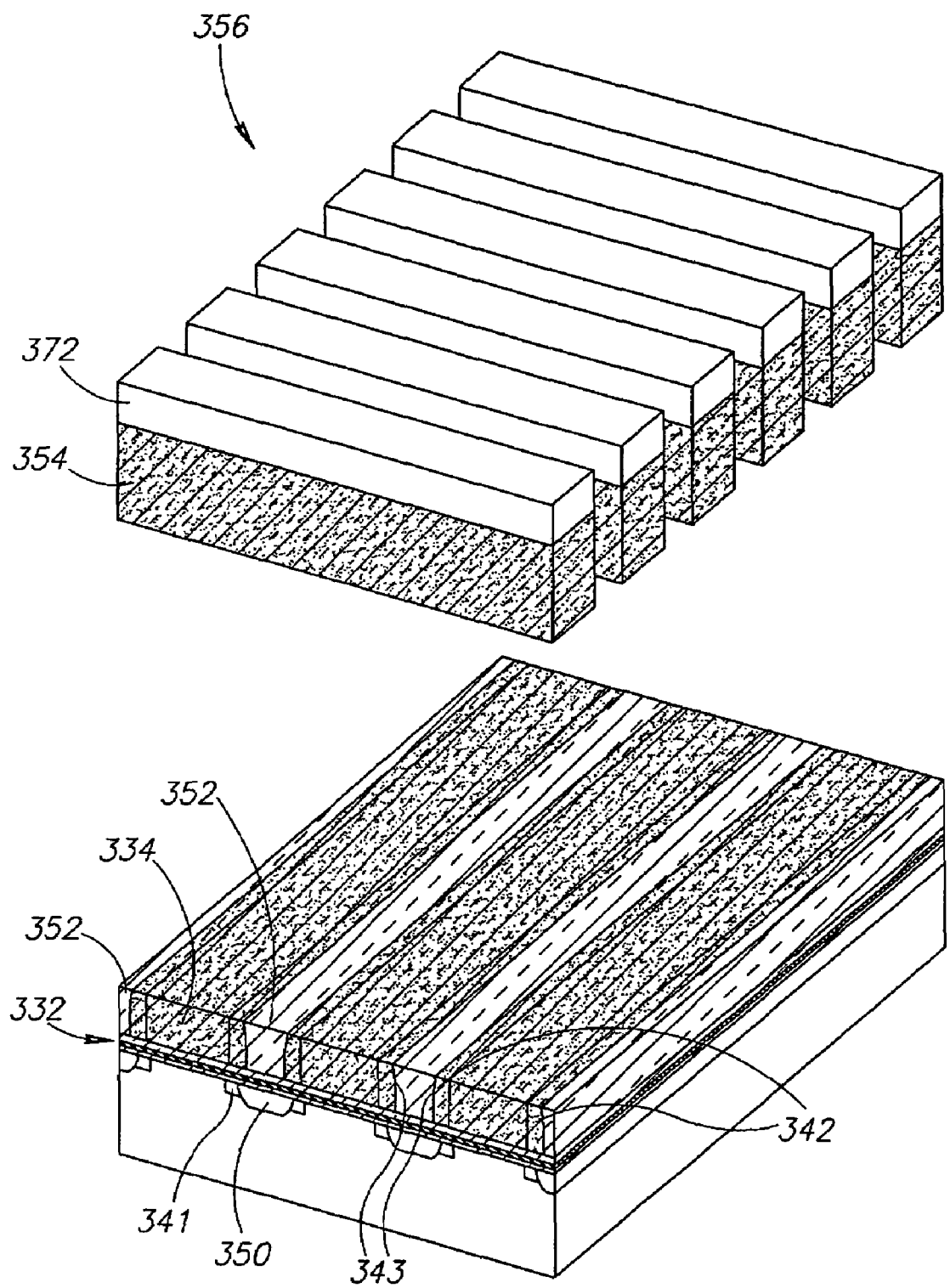
FIGS. 11A, 11B and 11C are expanded isometric illustrations of the cell during generation of word lines in the method of FIGS. 9A and 9B.

As can be seen in FIG. 11A, first etch (step 222) of SiON coating 372 and second polysilicon 354 may generate rows 356 of second polysilicon 345 and SiON coating 372. The etch may be set to stop on first polysilicon 334 or it may be a timed etch designed not to go through first polysilicon 334.

Between rows 356, bit line oxides 352 may be exposed alongside first polysilicon 334. Unfortunately, as shown in FIG. 11A, at least a portion of an upper surface 343 of polysilicon spacer 342 may be partially masked by bit line oxide 352 and thus, polysilicon spacer 342 would not have been reliably etched in a single polysilicon etch operation.

Figure 11B:
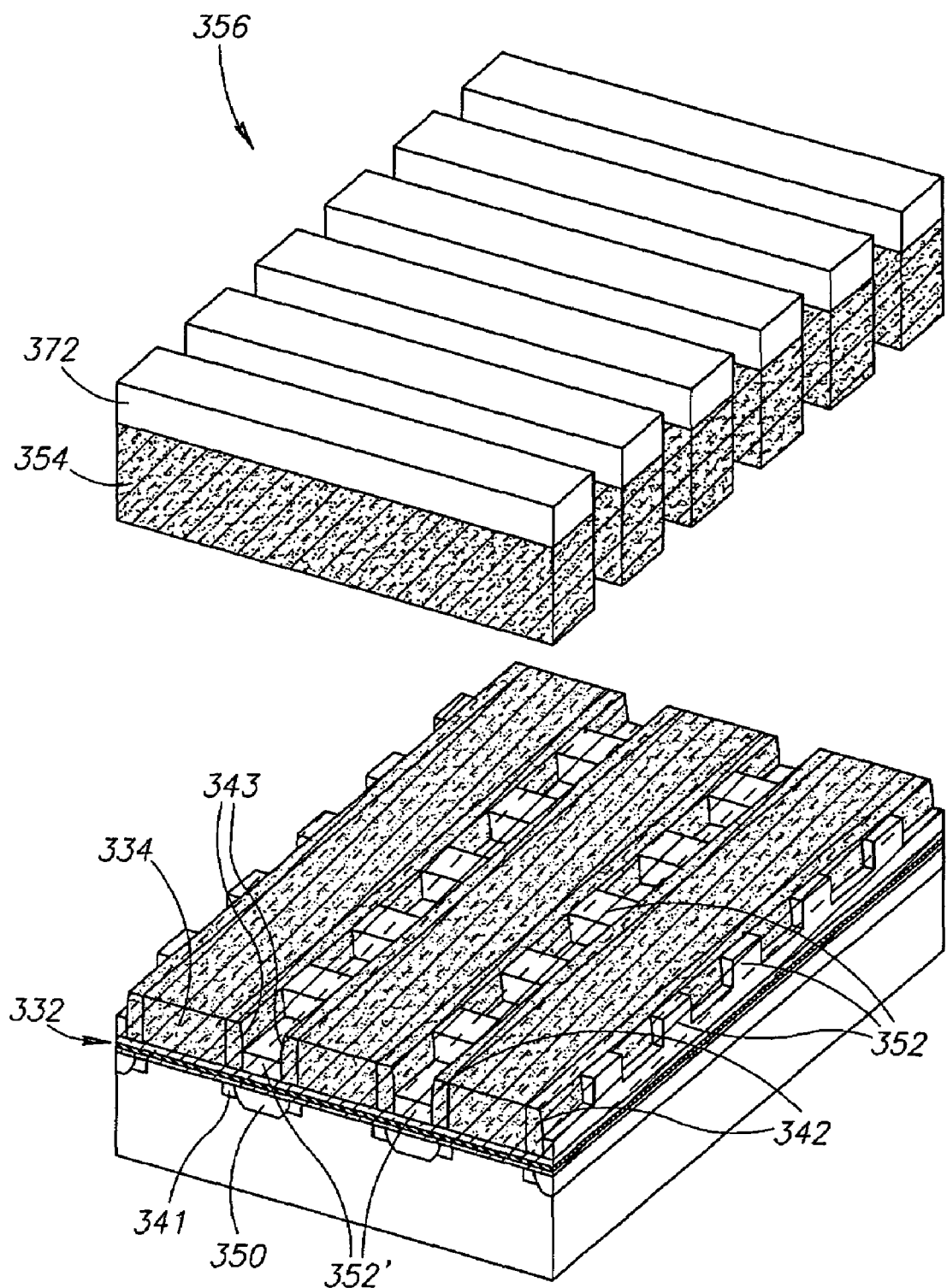
Figure 11C:
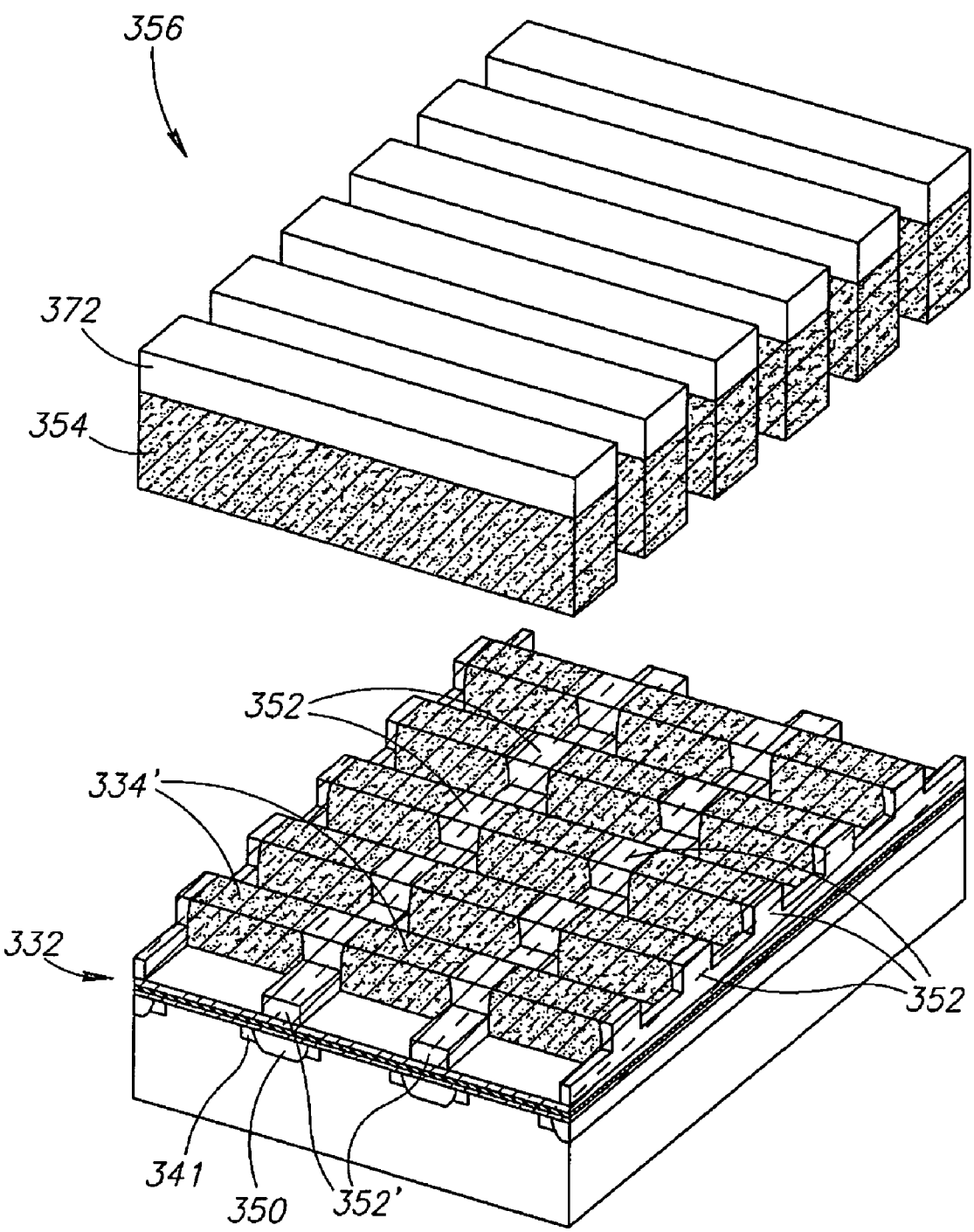

FIG. 11B illustrates the result of the oxide etch of step 223. In an exemplary embodiment, 20-30 nm of bit line oxide 352 may be removed, leaving about 30-70 nm of reduced bit line oxide, here labeled 352', above ONO 332. Reduced bit line oxide 352' may serve to protect bit line 350 during the polysilicon etch of step 224. It is noted that there may now be two bit line oxide thickness, that of bit line oxide 352 under the word line and that of reduced bit line oxide 352' between word lines.

The removal of a portion of bit line oxide 352 may expose upper surfaces 343 of spacers 342 in rows between word lines 356, such that spacers 342 may now be etched (step 224) between rows 256, together with first polysilicon columns 334.

FIG. 11C illustrates the result of step 224. ONO layer 332 has been exposed where not covered by reduced bit line oxide 352' and polysilicon columns 334 and spacers 342 have been formed into super-lithographic width polysilicon gates 334' which connect between channel 374 and polysilicon rows 356.

The process may now continue as in the first embodiment, from step 125 of FIG. 2B.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A non-volatile memory array comprising: columns of channels in a semiconductor substrate; columns of junctions at the edges of said channels; columns of diffusion bit lines between said junctions; polysilicon gates over charge trapping dielectric over said portions of said channels and overlapping at least portions of said junctions; a polysilicon spacer which forms at least a portion of said polysilicon gates; and bit line oxides extending to a height of said polysilicon gates under polysilicon word lines and are shorter than a height between said polysilicon word lines.

2. The array according to claim 1 and wherein said junctions are pocket implants.

3. The array according to claim 1 and wherein said polysilicon gates are at least partially formed of a first polysilicon layer and at least a portion of a polysilicon spacer.

4. The array according to claim 1 and wherein said polysilicon gates are at least partially formed of a first polysilicon layer.

5. The array according to claim 1 and further comprising bit line oxides extending to a height above said polysilicon gates.

6. The array according to claim 1 and further comprising bit line oxides extending to a height of said polysilicon gates.

7. The array according to claim 1 and further comprising bit line oxides next to said polysilicon gates and said oxides being wider at a top thereof than at a bottom thereof.

* * * * *